(12) United States Patent
Park et al.

(10) Patent No.: US 8,026,504 B2
(45) Date of Patent: Sep. 27, 2011

(54) SEMICONDUCTOR DEVICE AND METHOD OF FORMING THE SAME

(75) Inventors: Jun-Beom Park, Seoul (KR); Soon-Moon Jung, Seongnam-si (KR); Ki-Nam Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 187 days.

(21) Appl. No.: 12/379,814

(22) Filed: Mar. 2, 2009

(65) Prior Publication Data

US 2009/0218558 A1 Sep. 3, 2009

(30) Foreign Application Priority Data

Feb. 28, 2008 (KR) .................... 10-2008-0018334

(51) Int. Cl.
*H01L 47/00* (2006.01)
(52) U.S. Cl. ........ 257/4; 257/24; 257/E47.001; 257/E25.013; 365/185.17; 977/774
(58) Field of Classification Search ................ 257/4, 24, 257/295–310, 202, 211, 390, 393, 499, 500, 257/E25.013, E47.001, E21.664, E27.104; 365/163, 148, 185.17; 331/179; 438/109; 977/774

See application file for complete search history.

(56) References Cited

U.S. PATENT DOCUMENTS

| 6,432,766 | B1 | 8/2002 | Choi et al. |
| 6,700,146 | B2 | 3/2004 | Ito |
| 7,084,713 | B2 | 8/2006 | Peluso |
| 7,683,404 | B2 * | 3/2010 | Jang et al. ............. 257/211 |
| 2006/0108627 | A1 * | 5/2006 | Choi et al. ............. 257/314 |
| 2006/0120148 | A1 | 6/2006 | Kim et al. |
| 2006/0267086 | A1 * | 11/2006 | Furukawa et al. ......... 257/334 |
| 2008/0067554 | A1 * | 3/2008 | Jeong et al. ............. 257/211 |
| 2008/0087932 | A1 * | 4/2008 | Son et al. ............. 257/315 |
| 2008/0185648 | A1 * | 8/2008 | Jeong et al. ............. 257/347 |
| 2008/0272434 | A1 * | 11/2008 | Park et al. ............. 257/347 |

FOREIGN PATENT DOCUMENTS

| JP | 2003-229541 | 8/2003 |
| JP | 2005-311322 | 11/2005 |
| KR | 10-2002-0002989 | 1/2002 |
| KR | 10-2004-0107487 | 12/2004 |
| KR | 10-2005-0091902 | 9/2005 |
| KR | 10-2006-0129095 | 12/2006 |
| KR | 10-2007-0011787 | 1/2007 |

OTHER PUBLICATIONS

Korean Decision of Grant dated May 31, 2010.

* cited by examiner

*Primary Examiner* — Victor A Mandala
*Assistant Examiner* — Whitney Moore
(74) *Attorney, Agent, or Firm* — Harness, Dickey & Pierce, PLC

(57) ABSTRACT

A semiconductor device and a method of forming the same are provided. The method includes preparing a semiconductor substrate. Insulating layers may be sequentially formed on the semiconductor substrate. Active elements may be formed between the insulating layers. A common node may be formed in the insulating layers to be electrically connected to the active elements. The common node and the active elements may be 2-dimensionally and repeatedly arranged on the semiconductor substrate.

14 Claims, 17 Drawing Sheets

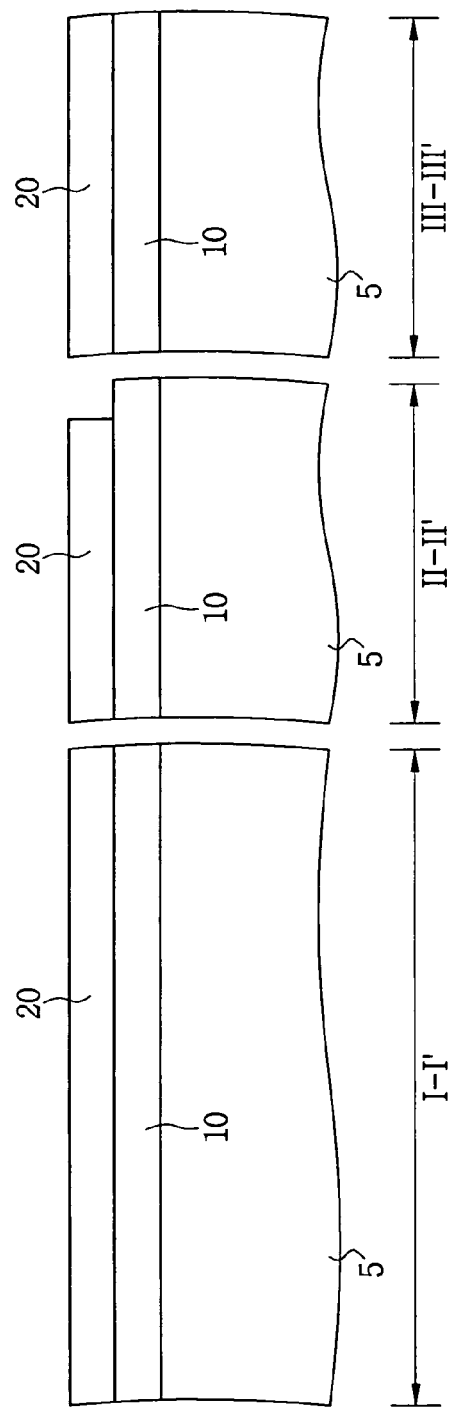
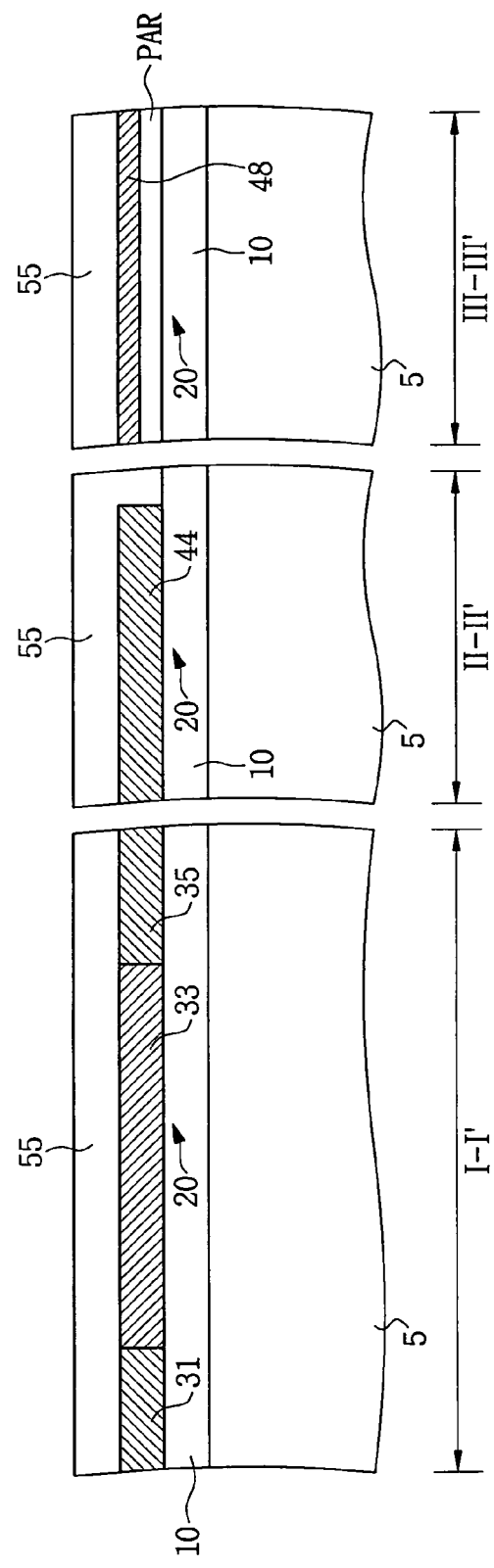

SEMICONDUCTOR DEVICE AND METHOD OF FORMING THE SAME

CROSS-REFERENCE TO RELATED APPLICATION

This application claims the benefit under 35 U.S.C. §119 to Korean Patent Application No. 10-2008-0018334, filed on Feb. 28, 2008 with the Korean Intellectual Property Office (KIPO), the entire contents of which are incorporated herein by reference.

BACKGROUND

1. Field

Example embodiments relate to a semiconductor device in which a common node and active devices are disposed perpendicular and parallel to a semiconductor substrate, respectively, and electrically connected to each other, and a method of forming the same.

2. Description of Related Art

In recent years, volatile and nonvolatile semiconductor memory devices have been fabricated using semiconductor substrates and silicon body regions on the semiconductor substrates in order to improve the integration density. The semiconductor substrate and the silicon body regions may be provided in the semiconductor device as discrete elements. The discrete elements of the semiconductor substrate or the silicon body regions may be active elements or passive elements that are electrically connected to one another. By use of active and passive elements, the integration density may be increased.

Conventional techniques for increasing the integration density of semiconductor devices using active and passive elements may provide highly integrated nonvolatile memory devices having memory cells, which extend perpendicular to a semiconductor substrate and are sequentially stacked on the semiconductor substrate, and interconnection lines disposed between the memory cells. However, as the number of memory cells stacked on the semiconductor substrate increases, a step difference between the memory cells formed on the semiconductor substrate increases, thereby deteriorating conditions of a semiconductor fabrication process.

SUMMARY

Example embodiments provide a semiconductor device having a common node disposed perpendicular to a semiconductor substrate and active elements that extend from the common node and are stacked on the semiconductor substrate.

Example embodiments also provide a method of forming a semiconductor device, which may improve conditions of a semiconductor fabrication process using active elements sequentially stacked on a semiconductor substrate and a common node electrically connected to the active elements at the same time.

According to example embodiments, a semiconductor device may comprise a semiconductor substrate having a cell array region and a peripheral circuit region. A common node is disposed on the semiconductor substrate in the cell array region. The common node has resistive memory elements. First and second active elements are electrically connected to the common node. The first and second active elements extend from a sidewall of the common node and are sequentially stacked on the semiconductor substrate. An insulating layer is disposed on the semiconductor substrate surrounding the common node and interposed between the first and second active elements.

According to example embodiments, the common node may comprise an inner common node extending perpendicularly upward from the semiconductor substrate. The common node may further comprise an outer common node electrically connected to the inner common node and extending parallel to the semiconductor substrate.

According to example embodiments, the inner common node may comprise: a conductive plug; a bistable resistance pattern surrounding a sidewall and a bottom surface of the conductive plug; and buffer layers disposed on a sidewall of the bistable resistance pattern. The resistive memory elements may be disposed in the bistable resistance pattern adjacent to the buffer layer.

According to example embodiments, the conductive plug may comprise one selected from the group consisting of polysilicon (poly-Si), metal, and metal nitride. The bistable resistance pattern may comprise one selected from the group consisting of phase-change material, conductive multilayer material, metallic oxide, and nano-material dot. The buffer layers may comprise metal silicide. The outer common node may comprise metal to be electrically connected to the conductive plug and the bistable resistance pattern.

According to example embodiments, the phase-change material may be chalcogenide comprising at least one of germanium (Ge), antimony (Sb), and tellurium (Te). The conductive multilayer material may comprise conductive molecule, metallic crystals, and conductive molecule that are sequentially stacked. The conductive molecules may comprise one selected from poly(N-vinylcarbazole) (PVK) and 2-Amino-4, 5-Imidazoledicarbonitrile (AIDCN).

According to example embodiments, the metallic oxide comprise compound of at least one selected from the group consisting of zirconium (Zr), titanium (Ti), tellurium (Te), strontium (Sr), antimony (Sb), praseodymium (Pr), niobium (Nb), nickel (Ni), manganese (Mn), germanium (Ge), selenium (Se), chromium (Cr), calcium (Ca), aluminum (Al) and silver (Ag), and oxygen (O). The nano-material dot may comprise one selected from the group consisting of silicon (Si), gold (Au), cobalt (Co), and tungsten (W).

The semiconductor device may further comprise at least one third active element electrically connected to the common node and disposed on the second active element. Each of the first through third active elements may be one selected from a diode and a transistor.

In case that the first through third active elements are the diodes, each of the first through third active elements may comprise a cell gate region and a cell active region disposed in a first body region. The cell gate region may be electrically connected to a first side of the cell active region and run perpendicular to the first side of the cell active region. A second side of the cell active region may be in contact with one of the buffer layers. The cell gate region and the cell active region may comprise different impurity ions. A width of the common node may be greater in size than a width of the first body region.

The semiconductor device may further comprise cell peripheral gate regions and first global transistors. The cell peripheral gate regions may be disposed to respectively correspond to the cell gate regions of the first through third active elements in an edge of the cell array region. The cell peripheral gate regions may be electrically connected to the cell gate regions of the first through third active elements, respectively.

The cell peripheral gate regions may be sequentially stacked to partially expose one another in the edge of the cell array region. The cell peripheral gate regions may be electrically connected to the peripheral impurity regions, respectively. The cell peripheral gate regions may comprise the same impurity ions as the cell gate region. The first global transistors may be disposed in the peripheral circuit region and have peripheral impurity regions disposed in a second body region. The first global transistors may be disposed at substantially the same level as one of the first through third active elements and the semiconductor substrate.

The semiconductor device may further include fourth active elements and second global transistors. The fourth active elements may be disposed opposite to the first through third active elements with respect to the common node and respectively correspond to the first through third active elements. The second global transistors may be electrically connected to the fourth active elements, respectively, and correspond to the first global transistors.

The peripheral impurity regions may comprise the same impurity ions as or different impurity ions from the cell peripheral gate regions. The fourth active elements may comprise the same structure as the first through third active elements. The first through fourth active elements, the cell peripheral gate regions, the common node, and the first and second global transistors may be 2-dimensionally disposed on the semiconductor substrate in the cell array region and the peripheral circuit region.

In case that the first through third active elements are transistors, each of the first through third active elements may comprise a cell gate pattern disposed on a first body region and cell source and drain regions disposed in the first body region and overlapping the cell gate pattern. The cell source region may be in contact with an electrode pattern. The cell drain region may be in contact with one selected from the buffer layers. A width of the common node may be greater in size than a width of the first body region.

The semiconductor device may further include cell peripheral gate patterns and first global transistors. The cell peripheral gate patterns may be disposed to respectively correspond to the cell gate patterns of the first through third active elements in an edge of the cell array region. The cell peripheral gate patterns may be electrically connected to the cell gate patterns of the first through third active elements, respectively. The cell peripheral gate patterns may be sequentially stacked to expose one another in the edge of the cell array region.

The cell peripheral gate patterns may be electrically connected to the peripheral impurity regions, respectively. The cell peripheral gate patterns may comprise the same impurity ions as the cell gate patterns. The first global transistors may be disposed in the peripheral circuit region and have peripheral impurity regions disposed in a second body region. The first global transistors may be disposed at substantially the same level as one of the first through third active elements and the semiconductor substrate.

The semiconductor device may further include fourth active elements and second global transistors. The fourth active elements may be disposed opposite to the first through third active elements with respect to the common node and respectively correspond to the first through third active elements. The second global transistors may be electrically connected to the fourth active elements, respectively, and correspond to the first global transistors. The peripheral impurity regions may comprise the same impurity ions as or different impurity ions from the cell peripheral gate patterns.

The cell source and drain regions may comprise one selected from the same impurity ions as or different impurity ions from the cell gate patterns. The fourth active elements may comprise the same structure as the first through third active elements. The first through fourth active elements, the cell peripheral gate patterns, the common node, and the first and second global transistors may be 2-dimensionally disposed on the semiconductor substrate in the cell array region and the peripheral circuit region.

According to other example embodiments, a method of forming a semiconductor device includes preparing a semiconductor substrate defined by a cell array region and a peripheral circuit region. First and second active elements are sequentially formed on the semiconductor substrate in the cell array region. A common node is formed to extend from an upper portion of the second active element toward the semiconductor substrate so that the common node is electrically connected to the first and second active elements. The first and second active elements are formed to protrude from a sidewall of the common node. The common node is formed to have resistive memory elements corresponding to the first and second active elements, respectively.

According to example embodiments, each of the first and second active elements may be one selected from a diode and a transistor.

According to example embodiments, when the first and second active elements are the diodes, forming the first and second active elements may comprise forming a pad insulating layer on the semiconductor substrate in the cell array region. A first body region may be formed on the pad insulating layer. The first body region may have a cell active region and a cell gate region to correspond to the first active element. An inter-body insulating layer may be formed to cover the first body region. A second body region may be formed on the inter-body insulating layer. The second body region may comprise the same structure as the first body region and correspond to the second active element.

According example embodiments, the first and second body regions may be semiconductor material comprising silicon (Si). The pad insulating layer and the inter-body insulating layer may comprise silicon oxide. The cell active region may be electrically connected to the cell gate region. The cell active region and the cell gate region may comprise different impurity ions. A width of the common node may be greater in size than each of widths of the first and second body regions.

According to example embodiments, forming the common node may comprise forming a photoresist layer on the inter-body insulating layer. The photoresist layer may have an opening exposing the inter-body insulating layer. The pad insulating layer and the inter-body insulating layer may be etched using the photoresist layer as an etch mask to form a through hole. The through hole may correspond to the opening of the photoresist layer and partially expose the cell active regions of the first and second body regions. The photoresist layer may be removed from the inter-body insulating layer. The common node may be formed on the inter-body insulating layer to fill the through hole.

When the first and second active elements are the transistors, forming the first and second active elements may comprise forming a pad insulating layer on the semiconductor substrate in the cell array region. A first body region corresponding to the first active element may be formed on the pad insulating layer.

The first body region may comprise a cell gate pattern disposed on the first body region and cell source and drain regions overlapping the cell gate pattern. An inter-body insulating layer may be formed on the pad insulating layer to cover the first body region and the cell gate pattern. A second body region may be formed on the inter-body insulating layer.

The second body region may comprise the same structure as the first body region and correspond to the second active element.

The first and second body regions may be semiconductor material comprising Si. The pad insulating layer and the inter-body insulating layer may comprise silicon oxide. The cell gate pattern may comprise conductive material. The cell source and drain regions may comprise the same impurity ions as the cell gate pattern. A width of the common node may be greater in size than each of widths of the first and second body regions.

Forming the common node may include forming a photoresist layer on the inter-body insulating layer. The photoresist layer may have an opening exposing the inter-body insulating layer. The pad insulating layer and the inter-body insulating layer may be etched using the photoresist layer as an etch mask to form a through hole. The through hole may correspond to the opening of the photoresist layer and partially expose the cell drain regions of the first and second body regions. The photoresist layer may be removed from the inter-body insulating layer. The common node may be formed on the inter-body insulating layer to fill the through hole.

The common node may comprise an inner common node and an outer common node. The inner and outer common nodes may be respectively formed substantially perpendicular and parallel to the semiconductor substrate. The inner common node may comprise buffer layers, a bistable resistance pattern, and a conductive plug. The buffer layers may comprise metal silicide to contact the first and second active elements, respectively.

The bistable resistance pattern may comprise one selected from the group consisting of phase-change material, conductive multilayer material, metallic oxide, and nano-material dot. The conductive plug may comprise one selected from the group consisting of poly-Si, metal, and metal nitride. The outer common node may comprise metal to be electrically connected to the conductive plug and the bistable resistance pattern.

The phase-change material may be chalcogenide comprising at least one of Ge, Sb, and Te. The conductive multilayer material may comprise conductive molecule, metallic crystals, and conductive molecule that are sequentially stacked. The conductive molecules may comprise one selected from PVK and AIDCN.

The metallic oxide may comprise compound of at least one selected from the group consisting of Zr, Ti, Te, Sr, Sb, Pr, Nb, Ni, Mn, Ge, Se, Cr, Ca, Al, Ag and O, and the nano-material dot may comprise one selected from the group consisting of Si, Au, Co, and W.

According to example embodiments, the method may further include forming third active elements opposite to the first and second active elements with respect to the common node. The third active elements may be formed simultaneously together with the first and second active elements to correspond to the first and second elements, respectively. Fourth active elements may be formed on the first through third active elements. The third and fourth active elements may be formed to have the same structure as the first and second active elements.

The common node and the first through fourth active elements may be 2-dimensionally formed on the semiconductor substrate. The resistive memory elements of the common node may be respectively formed adjacent to the buffer layers.

According to example embodiments, a unit memory cell array block may include a common node having a plurality of resistive memory elements, a first active element connected to one of the plurality of resistive memory elements at lower region of the common node, a second active element connected to other one of the plurality of resistive memory elements at upper portion of the common node, and stacked on the first active element, and an insulating layer surrounding the common node and interposed between the first and second active elements.

According to example embodiments, each of the first and second active elements may be one selected from a diode and a transistor.

According to example embodiments, a method of forming a semiconductor device may include preparing a semiconductor substrate defined by a cell array region and a peripheral circuit region, sequentially stacking and forming first and second active elements insulated by a first insulating layer on the semiconductor substrate in the cell array region, forming a common node having a sidewall contacting to the first and the second active elements and penetrating the insulating layer, wherein the common node is formed to have resistive memory element at the contact region of first and second active elements, respectively.

BRIEF DESCRIPTION OF THE DRAWINGS

Example embodiments are described in further detail below with reference to the accompanying drawings. It should be understood that various aspects of the drawings may have been exaggerated for clarity:

FIGS. 7 through 11 are cross-sectional views illustrating a method of forming a semiconductor device taken along lines I-I', II-II', and III-III' of FIG. 3.

DETAILED DESCRIPTION OF EXAMPLE EMBODIMENTS

Various example embodiments will now be described more fully with reference to the accompanying drawings in which some example embodiments are shown. This example embodiments may, however, be embodied in different forms and should not be construed as limited thereto set forth herein. Rather, these embodiments are provided so that this disclosure is thorough and complete and fully conveys the scope of the inventive concept to one skilled in the art. It will be understood that although the terms "bistable resistance pattern", "resistive memory portion", "body region", and "common node" are used herein to describe various elements, the elements should not be limited by these terms. These terms are only used to distinguish one element from another element. As used herein, the term "at least one" includes any and all combinations of one or more of the associated listed items. Spatially relative terms, such as "under", "selected", "other", "remaining", "upper", "lower", and "on" and the like, may be used herein for ease of description to describe one element or feature's relationship to another element(s) or feature(s) as illustrated in the figures. The terminology used herein is for the purpose of describing particular embodiments only and is not intended to be limiting of the example embodiments.

Figure 1:
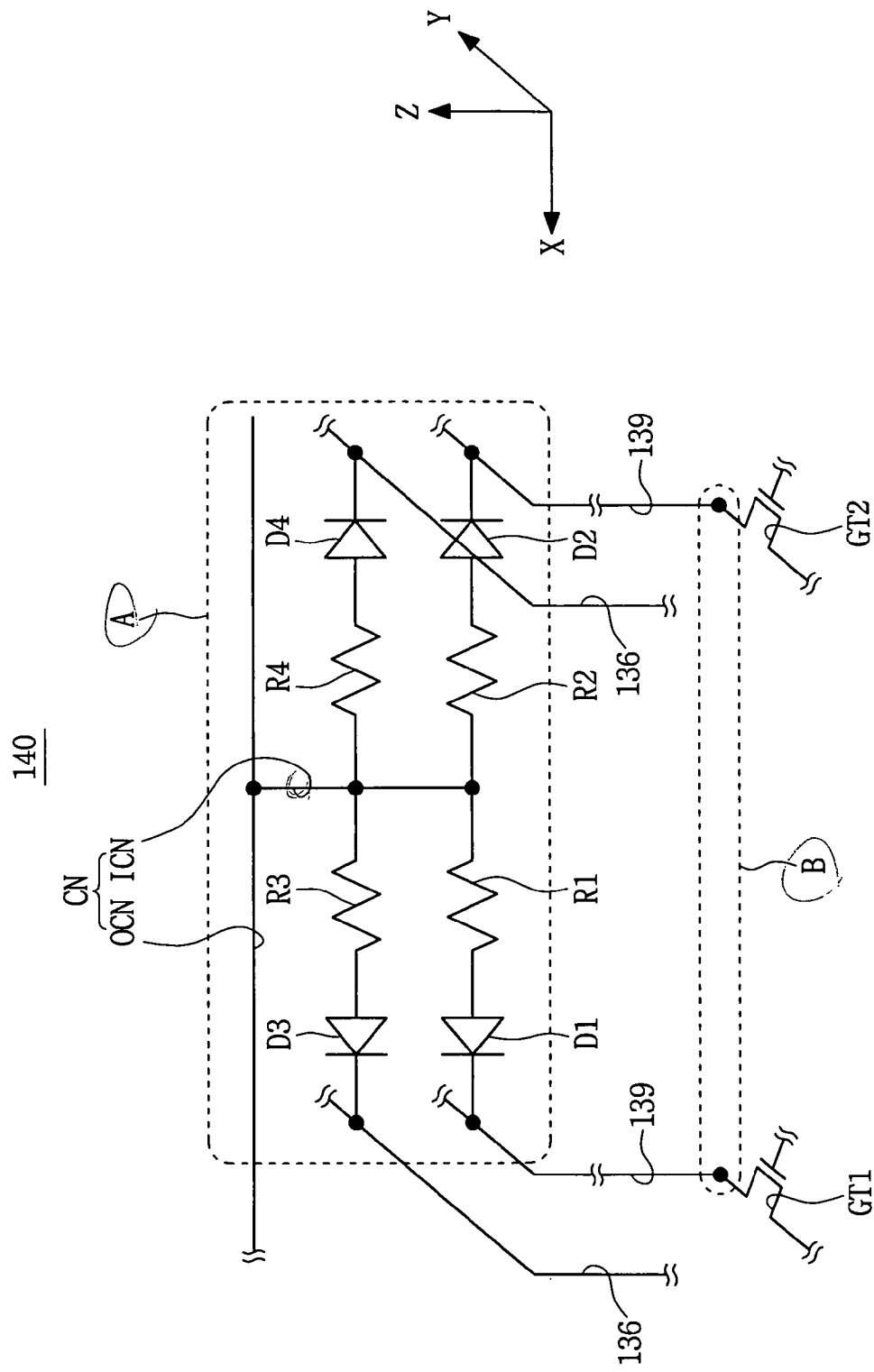
FIGS. 1 and 2 are circuit diagrams showing a semiconductor device according to example embodiments.
Figure 3:
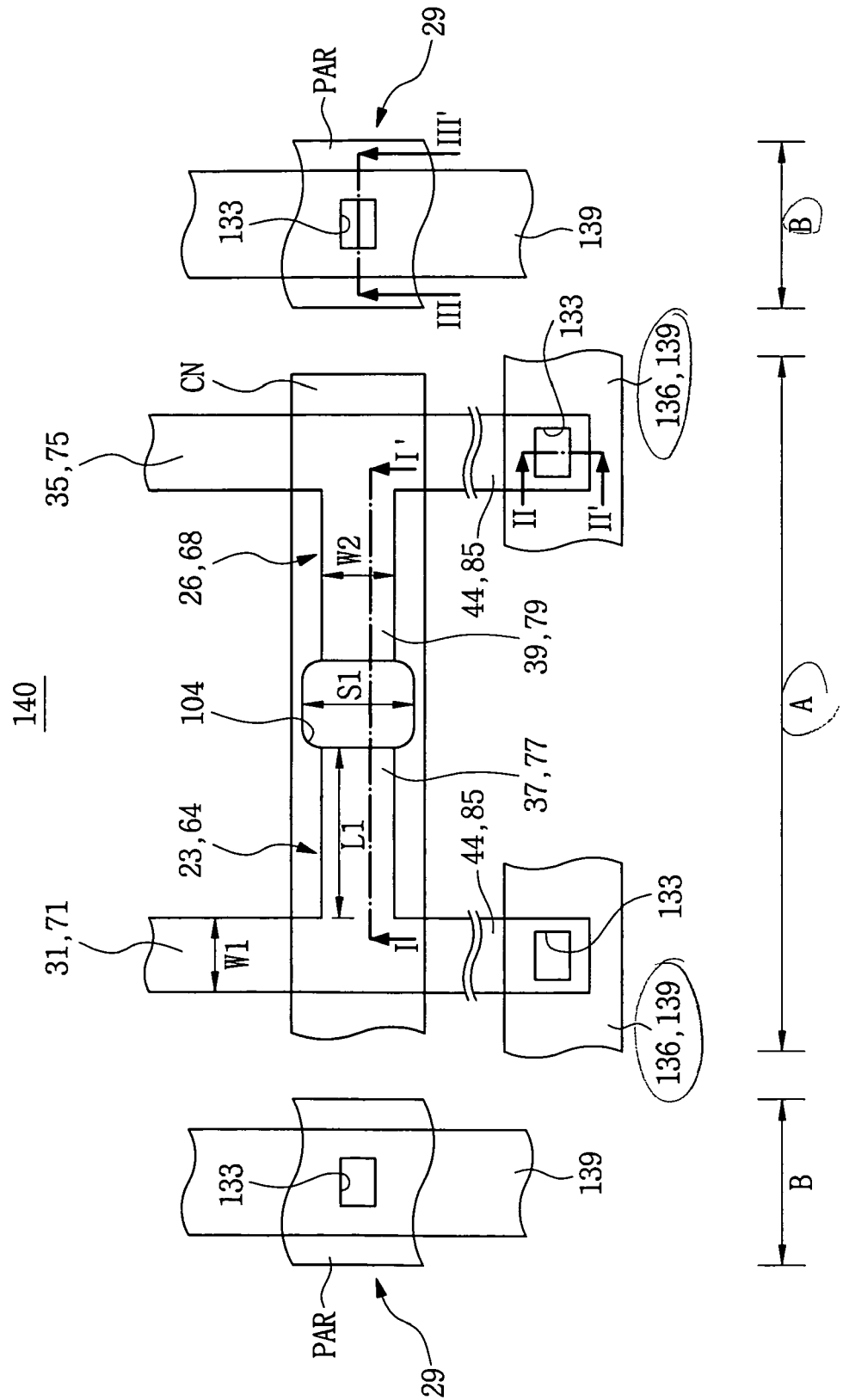
FIGS. 3 and 4 are plan views showing regions A and B of FIGS. 1 and 2, respectively.
Figure 5:
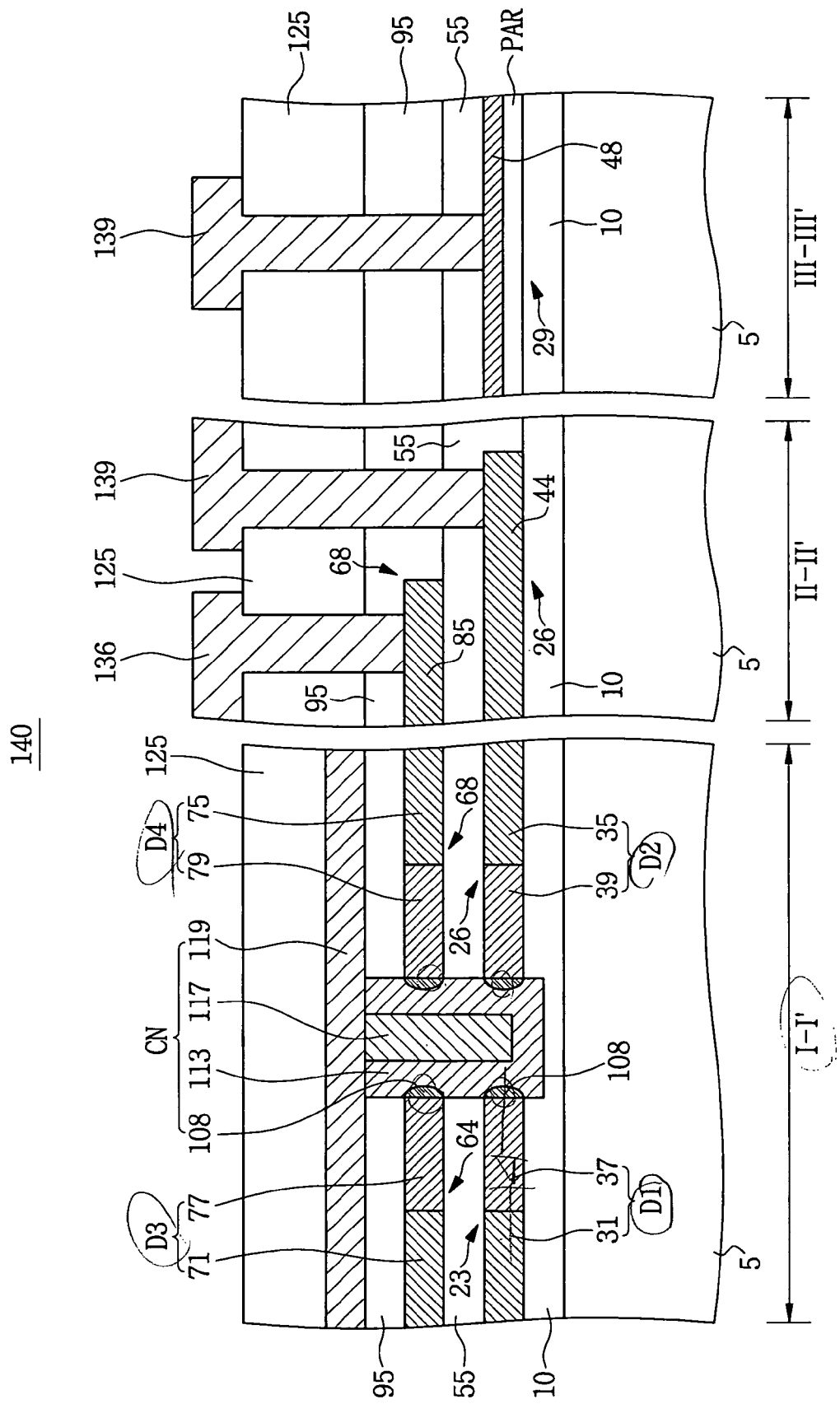
FIGS. 5 and 6 are cross-sectional views showing a semiconductor device taken along lines I-I', II-II', and III-III' of FIGS. 3 and 4, respectively.

FIG. 1 is a circuit diagram showing a semiconductor device according to example embodiments, FIG. 3 is a plan view showing regions A and B of FIG. 1, and FIG. 5 is a cross-sectional view showing a semiconductor device taken along lines I-I', II-II', and III-III' of FIG. 3.

Referring to FIG. 1, a semiconductor device 140 may comprise a cell array region and a peripheral circuit region on a semiconductor substrate 5 of FIG. 5. The cell array region may comprise a unit cell array block A, which may have a plurality of active elements, a plurality of resistive memory elements and a single common node CN. The active elements may be first through fourth diodes D1, D2, D3, and D4, respectively. The first through fourth diodes D1, D2, D3, and D4 may have the same structure or different structures. First terminals of the first through fourth diodes D1, D2, D3, and D4 may be electrically connected to the common node CN through resistive memory elements R1, R2, R3, and R4, respectively.

Second terminals of the first through fourth diodes D1, D2, D3, and D4 may be electrically connected to first and second global transistors GT1 and GT2 and third global transistors (not shown) of an edge B of a unit peripheral circuit block, which is disposed in the peripheral circuit region adjacent to the cell array region. For this, the second terminals of the first and second diodes D1 and D2 may be electrically connected to the first and second global transistors GT1 and GT2 through first gate connection patterns 139. Also, the second terminals of the third and fourth diodes D3 and D4 may be electrically connected to the third global transistors through second gate connection patterns 136.

The common node CN may be disposed perpendicular to the first through fourth diodes D1, D2, D3, and D4. The common node CN may be electrically connected to the first through fourth diodes D1, D2, D3, and D4 through resistive memory elements R1, R2, R3, and R4, respectively. The common node CN may be electrically connected to a common node connection pattern 119. The resistive memory elements R1, R2, R3, and R4 may be disposed in the common node CN and electrically connected to the first through fourth diodes D1, D2, D3, and D4, respectively. The resistive memory elements R1, R2, R3, and R4 may be formed in predetermined or desired regions of the common node CN during the formation of the semiconductor device 140. The resistive memory elements R1, R2, R3, and R4 may be data storage elements of the semiconductor device 140. The resistive memory elements R1, R2, R3, and R4 may constitute memory cells along with the first through fourth diodes D1, D2, D3, and D4. Fifth and sixth diodes may be further disposed along a Z-axis between the third and fourth diodes D3 and D4 and the common node connection pattern 119 and correspond to the third and fourth diodes D3 and D4, respectively. The fifth and sixth diodes may have the same structure as the third and fourth diodes D3 and D4 and may be electrically connected to the common node CN. Furthermore, the common node CN, the first through fourth diodes D1, D2, D3, and D4, the fifth and sixth diodes, the first and second global transistors GT1 and GT2, and the third global transistors may be 2-dimensionally arranged along X- and Y-axes on the semiconductor substrate 5 of FIG. 5.

Referring to FIG. 3, the semiconductor device 140 according to example embodiments may have first and second body regions. The first body regions may be disposed in the cell array region and the peripheral circuit region along the X- and Y-axes of FIG. 1. A portion of the first body regions may be disposed in the unit cell array block A of FIG. 1 and constitute first cell body regions 23 and 26. The first cell body region 23 may be disposed toward a through hole 104 of the cell array region. The first cell body region 26 may be s disposed opposite to the first cell body region 23 with respect to the through hole 104. The remaining first body region may be disposed in the peripheral circuit region and constitute peripheral body regions 29.

The first cell body region 23 may have a cell gate region 31 and a cell active region 37. The first cell body region 26 may have a cell gate region 35 and a cell active region 39. Each of the first cell body regions 23 and 26 may further comprise a cell peripheral gate region 44 disposed in an edge of the cell array region. Each of the peripheral body regions 29 may have a peripheral active region PAR. The peripheral active region PAR may correspond to a source region or a drain region of the global transistor GT1 or GT2 disposed in the edge B of the unit peripheral circuit block of FIG. 1.

The semiconductor device 140 may have the second body regions disposed along the Z-axis of FIG. 1. The second body regions may be disposed to correspond to the portion of the first body regions of the cell array region along the X- and Y-axes of FIG. 1. The second body regions may be disposed in the unit cell array block A and constitute second cell body regions 64 and 68. The second cell body region 64 may be disposed toward the through hole 104 of the cell array region. The second cell body region 64 may have a cell gate region 71 and a cell active region 77. The second cell body region 68 may be disposed opposite to the second cell body region 64 with respect to the through hole 104. The second cell body region 68 may have a cell gate region 75 and a cell active region 79. Each of the second cell body regions 64 and 68 may further have a cell peripheral gate region 85 disposed in the edge of the cell array region. The cell gate regions 71 and 75, the cell active regions 77 and 79, and the cell peripheral gate region 85 in the second body regions may correspond to the cell gate regions 31 and 35, the cell active regions 37 and 39, and the cell peripheral gate region 44 in the portion of the first body regions of the cell array region.

The cell gate regions 31, 35, 71, and 75 and the cell peripheral gate regions 44 and 85 in the first and second body regions may have the same width W1. Alternatively, the cell gate regions 31, 35, 71, and 75 and the cell peripheral gate regions 44 and 85 in the first and second body regions may have different widths. The cell active regions 37, 39, 77, and 79 in the first and second body regions may have the same length L1 and width W2 or different lengths and widths. The cell gate regions 31, 35, 71, and 75 may run perpendicular to the cell active regions 37, 39, 77, and 79 along the Y-axis of FIG. 1 in the first and second body regions and be electrically connected to the cell active regions 37, 39, 77, and 79.

The cell active regions 37, 39, 77, and 79 in the first and second body regions may be electrically connected to the common node CN through the through hole 104. A diameter S1 of the through hole 104 may be greater in size than the width W2 of the cell active regions 37, 39, 77, and 79. The cell active regions 37, 39, 77, and 79 may be separated from one another by the through hole 104. The cell peripheral gate regions 44 and 85 in the first and second body regions may be electrically connected to the gate connection patterns 136 and 139 through connection holes 133, respectively.

The peripheral active regions PAR in the peripheral body regions 29 may be electrically connected to the gate connection patterns 139 through connection holes 133, respectively. The peripheral active regions PAR may be electrically connected to one 44 of the cell peripheral gate regions 44 and 85 through the gate connection patterns 139. The cell gate regions 31, 35, 71, and 75, the cell peripheral gate regions 44 and 85, the cell active regions 37, 39, 77, and 79, the common node CN, and the peripheral active regions PAR may be repetitively arranged in the cell array region and the peripheral circuit region along the X- and Y-axes of FIG. 1.

Referring to FIG. 5, in example embodiments, the common node CN may be disposed on the semiconductor substrate 5 as shown in FIG. 1 or 3. The semiconductor substrate 5 may have the cell array region and the peripheral circuit region. The semiconductor substrate 5 may be made of a semiconductor material comprising silicon (Si). The common node CN may be disposed on the semiconductor substrate 5 in the cell array region. The common node CN may extend perpendicularly upward from the semiconductor substrate 5, as shown in FIG. 1. The common node CN may have buffer layers 108, a bistable resistance pattern 113, and/or a conductive plug 117. The buffer layers 108 may be disposed at contact regions between a sidewall of the bistable resistance pattern 113 and the corresponding cell active regions and comprise metal silicide. The bistable resistance pattern 113 may be interposed between the buffer layers 108 and the conductive plug 117 and surround a sidewall and a bottom surface of the conductive plug 117. The bistable resistance pattern 113 may comprise at least one material that exhibits a low resistance and a high resistance reversibly depending on the amount of Joule's heat.

The conductive plug 117 may comprise polysilicon (poly-Si), metal, or metal silicide. The common node CN may be electrically connected to the common node connection pattern 119, which extends parallel to the semiconductor substrate 5. The common node connection pattern 119 may be referred to as a reference numeral 119. The common node connection pattern 119 may comprise a metal. The common node connection pattern 119 may be a bit line in the semiconductor device 140. In the common node CN, the bistable resistance pattern 113 disposed adjacent to the buffer layers 108 may have the resistive memory elements R1, R2, R3, and R4 of FIG. 1. The resistive memory elements R1, R2, R3, and R4 may be the data storage elements. The active elements may be disposed to be electrically connected to the common node CN through the resistive memory elements R1, R2, R3, and R4, respectively. The active elements may be the first through fourth diodes D1, D2, D3, and D4. The first and second diodes D1 and D2 may be disposed in the first cell body regions 23 and 26 of the first body regions, respectively.

The first diode D1 may comprise the cell gate region 31 and the cell active region 37 of the first cell body region 23. The second diode D2 may comprise the cell gate region 35 and the cell active region 39 of the first cell body region 26. The third and fourth diodes D3 and D4 may be disposed in the second cell body regions 64 and 68 of the second body regions, respectively. The third diode D3 may comprise the cell gate region 71 and the cell active region 77 of the second cell body region 64. The fourth diode D4 may comprise the cell gate region 75 and the cell active region 79 of the second cell body region 68.

The first and second body regions may be a semiconductor material comprising Si. First sides of the cell active regions 37, 39, 77, and 79 may be electrically connected to the cell gate regions 31, 35, 71, and 75, respectively. Second sides of the cell active regions 37, 39, 77, and 79 may be electrically connected to the common node CN through the buffer layers 108. The cell gate regions 31, 35, 71, and 75 may comprise different impurity ions from those of the cell active regions 37, 39, 77, and 79. The cell gate regions 31, 35, 71, and 75 may comprise N-type impurity ions, while the cell active regions 37, 39, 77, and 79 may comprise P-type impurity ions. Alternatively, the cell gate regions 31, 35, 71, and 75 may comprise P-type impurity ions, while the cell active regions 37, 39, 77, and 79 may comprise N-type impurity ions.

The first and second diodes D1 and D2 may be disposed on lower sides of the common node CN. The third and fourth diodes D3 and D4 may be disposed on upper sides of the common node CN to correspond to the first and second diodes D1 and D2, respectively. The first and third diodes D1 and D3 may be disposed symmetrically to the second and fourth diodes D2 and D4 with respect to the common node CN and extend in a different direction from the second and fourth diodes D2 and D4. The first through fourth diodes D1, D2, D3, and D4 may extend from a sidewall of the common node CN. The first and second cell body regions 26 and 68 may be disposed in the first and second body regions, respectively, and extend toward the edge of the cell array region. The first and second cell body regions 26 and 68 in the edge of the cell array region may have the cell peripheral gate regions 44 and 85, respectively. The cell peripheral gate regions 44 and 85 may be electrically connected to the cell gate regions 35 and 75 in the first and second cell body regions 26 and 68 in the cell array region, respectively. The cell peripheral gate regions 44 and 85 may comprise the same impurity ions as the cell gate regions 35 and 75.

The peripheral body region 29 may be disposed in the first body region of the peripheral circuit region. The peripheral body region 29 may have the peripheral active region PAR for the second global transistor GT2 of FIG. 1. The peripheral active region PAR may have a peripheral impurity region 48, which may be one of the source and drain regions of the second global transistor GT2. The peripheral impurity region 48 may comprise the same impurity ions as or different impurity ions from the cell peripheral gate regions 44 and 85. The first and second global transistors GT1 and GT2 may be disposed at substantially the same level as one of the semiconductor substrate 5 and second body region other than the peripheral body region 29. When the first and second global transistors GT1 and GT2 is disposed on the semiconductor substrate 5 in the peripheral circuit region, the peripheral body region 29 of the first body region may be removed. A pad insulating layer 10, an inter-body insulating layer 55, and a planarized insulating layer 95 may be sequentially disposed between the semiconductor substrate 5 and the common node connection pattern 119. The pad insulating layer 10 may be interposed between the semiconductor substrate 5 and the first body regions. The inter-body insulating layer 55 may be interposed between the first and second body regions. The planarized insulating layer 95 may be interposed between the second body regions and the common node connection pattern 119.

The pad insulating layer 10, the inter-body insulating layer 55, and the planarized insulating layer 95 may cover the first and second body regions in the cell array region and the peripheral circuit region and also surround the common node CN. A protection insulating layer 125 may be disposed on the planarized insulating layer 95 and cover the common node connection pattern 119. The gate connection patterns 136 and 139 may be disposed to electrically connect the cell peripheral gate regions 44 and 85 in the edge of the cell array region to the peripheral body region 29 in the peripheral circuit region. The gate connection patterns 136 and 139 may comprise a conductive material. The gate connection pattern 136 may penetrate the planarized insulating layer 95 and the protection insulating layer 125, and the gate connection pattern 139 may penetrate the inter-body insulating layer 55, the planarized insulating layer 95, and the protection insulating layer 125. The cell peripheral gate region 44 of the first cell body region 26 may be electrically connected to the peripheral impurity region 48 of the peripheral body region 29 through the gate connection pattern 139 as shown in FIG. 1.

Figure 2:
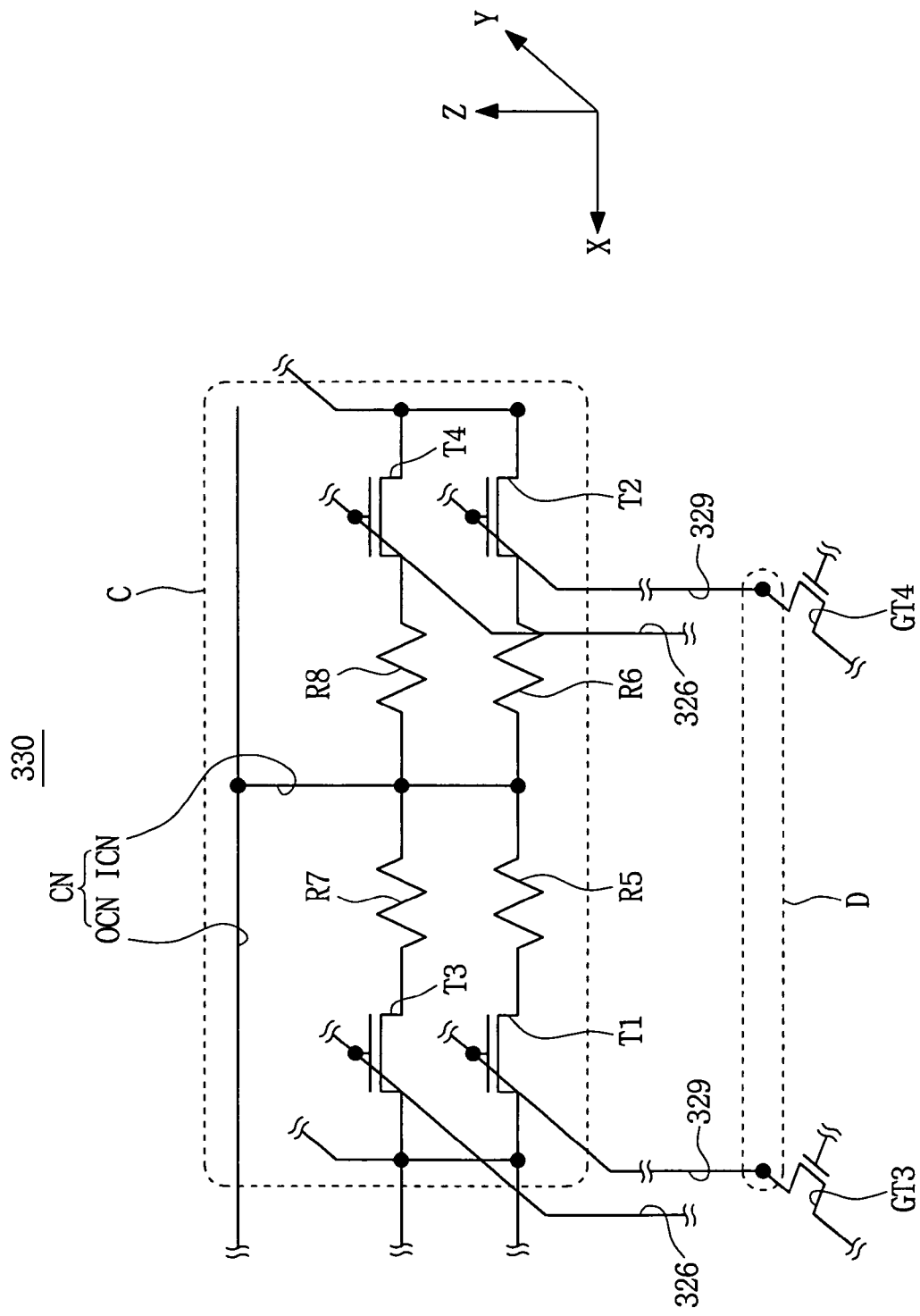
Figure 4:
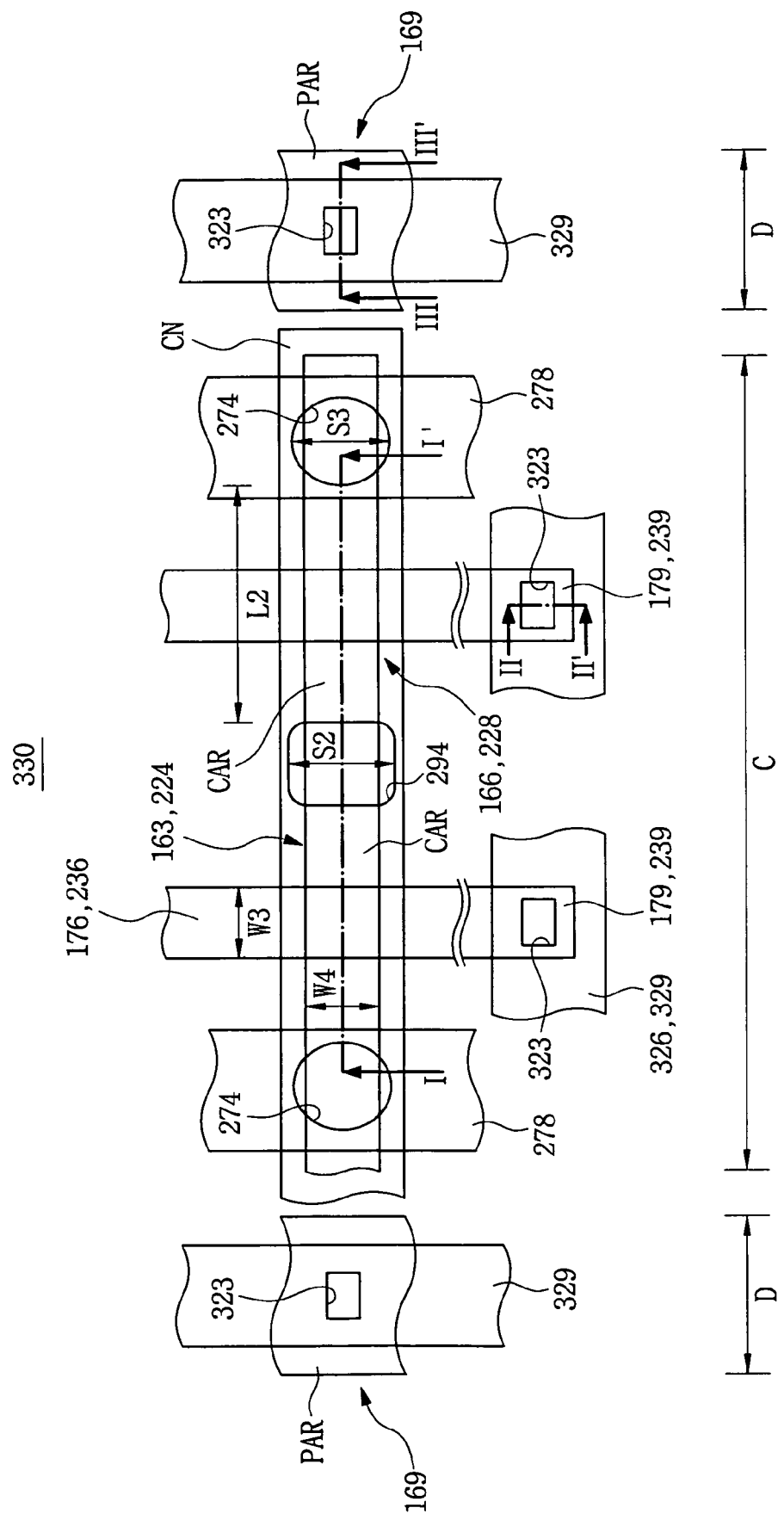
Figure 6:
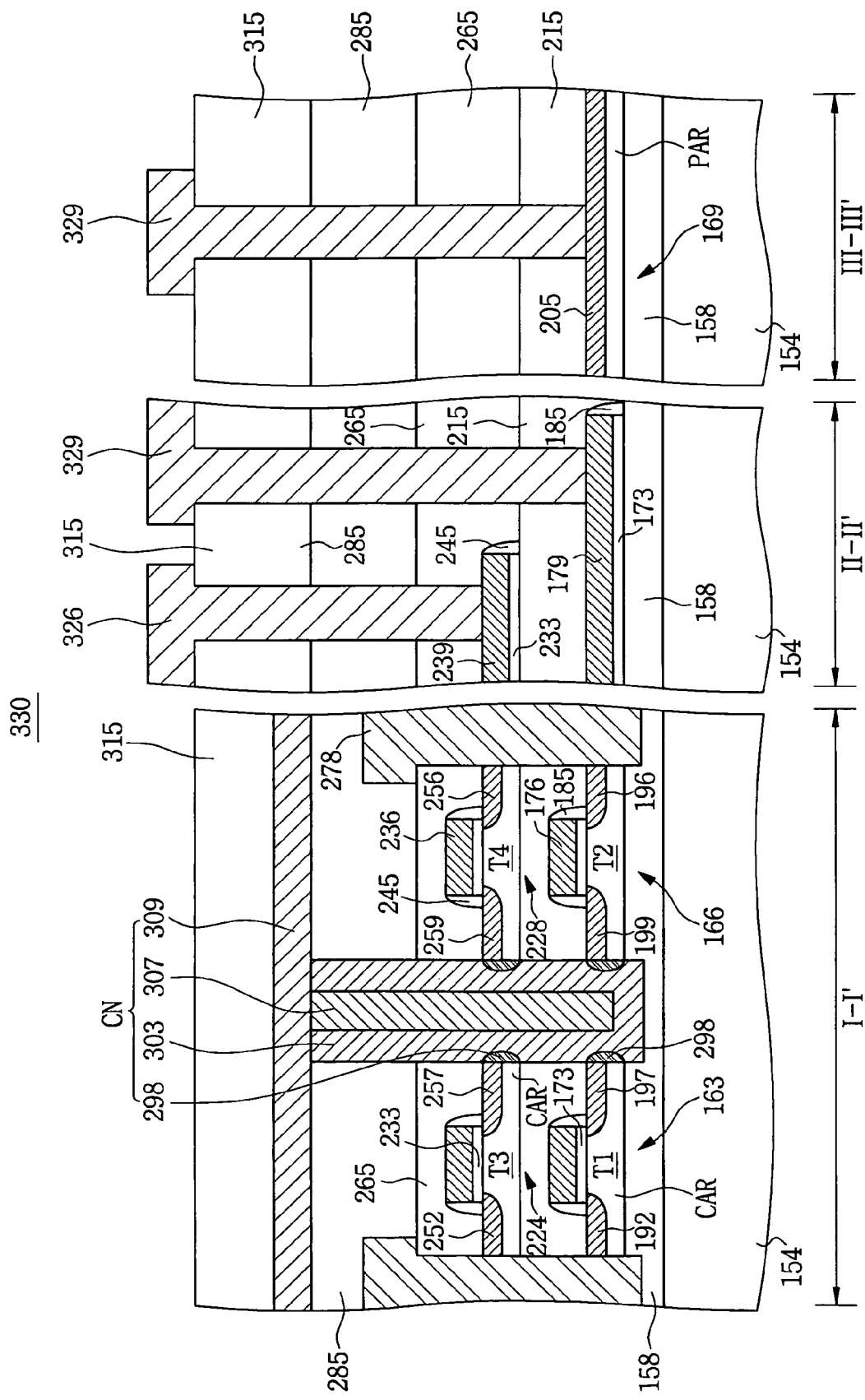

FIG. 2 is a circuit diagram showing a semiconductor device according to example embodiments, FIG. 4 is a plan view showing regions A and B of FIG. 2, and FIG. 6 is a cross-sectional view showing a semiconductor device taken along lines I-I', II-II', and III-III' of FIG. 4.

Referring to FIG. 2, a semiconductor device 330 according to example embodiments may comprise a cell array region and a peripheral circuit region disposed on a semiconductor substrate 154 of FIG. 6. The cell array region may comprise a unit cell array block C. The unit cell array block C may comprise a plurality of active elements, a plurality of resistive memory elements and a single common node CN. The active elements may be first through fourth transistors T1, T2, T3, and T4, respectively. The first through fourth transistors T1, T2, T3, and T4 may have the same structure or different structures. The first through fourth transistors T1, T2, T3 and T4 may be electrically to the common node CN through the plurality of resistive memory elements R5, R6, R7, and R8, respectively. For this, first terminals of the first through fourth transistors T1, T2, T3, and T4 may be electrically connected to the common node CN through the corresponding resistor, respectively.

Second terminals of the first through fourth transistors T1, T2, T3, and T4 may be electrically connected to first and second global transistors GT3 and GT4 and third global transistors (not shown) disposed in an edge D of a unit peripheral circuit block, which is disposed in the peripheral circuit region adjacent to the cell array region. For this, the second terminals of the first and second transistors T1 and T2 may be electrically connected to the first and second global transistors GT3 and GT4 through first gate connection patterns 329. Also, the second terminals of the third and fourth transistors T3 and T4 may be electrically connected to the third global transistors through second gate connection patterns 326. A third terminal of the first through fourth transistors T1, T2, T3, and T4 may be electrically connected to a reference voltage through a reference connection pattern 278.

The common node CN may be disposed perpendicular to the first through fourth transistors T1, T2, T3, and T4. The common node CN may be electrically connected to the first through fourth transistors T1, T2, T3, and T4 through the plurality of resistive memory elements R5, R6, R7, and R8. The common node CN may be electrically connected to a common node connection pattern 309. The resistive memory elements R5, R6, R7, and R8 may be disposed in the common node CN and electrically connected to the first through fourth transistors T1, T2, T3, and T4, respectively. The resistive memory elements R5, R6, R7, and R8 may be formed in predetermined or desired regions of the common node CN during the formation of the semiconductor device 330. The resistive memory elements R5, R6, R7, and R8 may be data storage elements of the semiconductor device 330. The resistive memory elements R5, R6, R7, and R8 may constitute memory cells along with the first through fourth transistors T1, T2, T3, and T4. Fifth and sixth transistors may be further disposed along a Z-axis among the third and fourth transistors T3 and T4 and the common node CN and correspond to the third and fourth transistors T3 and T4, respectively. The fifth and sixth transistors may have the same structure as the third and fourth transistors T3 and T4 and be electrically connected to the common node CN. Furthermore, the common node CN, the first through fourth transistors T1, T2, T3, and T4, the fifth and sixth transistors, the first and second global transistors GT3 and GT4, and the third global transistors may be 2-dimensionally arranged along X- and Y-axes on the semiconductor substrate 154 of FIG. 6.

Referring to FIG. 4, the semiconductor device 330 according to example embodiments may have first and second body regions. The first body regions may be disposed in the cell array region and the peripheral circuit region along the X- and Y-axes of FIG. 2. A portion of the first body regions may be disposed in the unit cell array block C of FIG. 2 and comprise first cell body regions 163 and 166. The first cell body region 163 may be disposed toward a through hole 294 of the cell array region. The first cell body region 166 may be disposed opposite to the first cell body region 163 with respect to the through hole 294. The remaining first body region may be disposed in the peripheral circuit region and constitute peripheral body regions 169.

The first cell body regions 163 and 166 may comprise cell active regions 1-CAR and cell gate patterns 176. The cell gate patterns 176 may be disposed on the first cell body regions 163 and 166. The first cell body regions 163 may have cell peripheral gate patterns 179 disposed in an edge of the cell array region. The cell gate patterns 176 of the first cell body regions 163 and 166 may be electrically connected to the cell peripheral gate patterns 179 in the edge of the cell array region. Each of the peripheral body regions 169 may have a peripheral active region PAR. Each of the peripheral active regions PAR may correspond to a source region or a drain region of the global transistor GT3 or GT4 in the edge D of the unit peripheral circuit block of FIG. 2.

The semiconductor device 330 may have the second body regions on the first body regions along a Z-axis of FIG. 2. The second body regions may be disposed to correspond to the portion of the first body regions of the cell array region along the X- and Y-axes of FIG. 2. The second body regions may be disposed in the unit cell array block C and comprise second cell body regions 224 and 228. The second cell body region 224 may be disposed toward the through hole 294 of the cell array region. The second cell body region 228 may be disposed opposite to the second cell body region 224 with respect to the through hole 294. The second cell body regions 224 and 228 may have cell gate patterns 236 and cell active regions 2-CAR. The cell gate patterns 236 may be disposed on the second cell body regions 224 and 228. The second cell body regions 224 and 228 may have cell peripheral gate regions 239 in the edge of the cell array region. The cell gate patterns 236 of the second cell body regions 224 and 228 may be electrically connected to the cell peripheral gate patterns 239 in the edge of the cell array region.

The cell active regions 2-CAR, the cell gate patterns 236, and the cell peripheral gate pattern 239 in the second body regions may correspond to the cell active regions 1-CAR, the cell gate patterns 176, and the cell peripheral gate pattern 179 in the portion of the first body regions. The cell active regions 1-CAR and 2-CAR in the first and second body regions may have the same width W4 or different widths. The cell active regions 1-CAR and 2-CAR in the first and second body regions may have the same length L2 or different lengths. The cell gate patterns 176 and 236 may run perpendicular to the cell active regions 1-CAR and 2-CAR along the X-axis of FIG. 2 in the first and second body regions. The cell gate patterns 176 and 236 may have the same width W3 or different widths in the first and second body regions. First terminals of the cell active regions 1-CAR and 2-CAR in the first and second body regions may be electrically connected to reference connection patterns 278 through an electrode hole 274. Second terminals of the cell active regions 1-CAR and 2-CAR in the first and second body regions may be electrically connected to the common node CN through a through hole 294. The common node CN may be include resistive memory elements R5, R6, R7, and R8 as shown in FIG. 2.

A width S2 of the through hole 294 and a diameter S3 of the contact hole 274 may be greater than the width W4 of each of the cell active regions 1-CAR and 2-CAR. The electrode hole 274 and the through hole 294 may define a cell active region being selected in cell active regions 1-CAR and 2-CAR along the X-axis of FIG. 2. The cell peripheral gate patterns 179 and 239 in the first and second body regions may be electrically connected to the gate connection patterns 326 and 329 through connection holes 323, respectively. The peripheral active regions PAR in the peripheral body regions 169 may be electrically connected to the gate connection patterns 329 through connection holes 323, respectively. The peripheral active regions PAR may be electrically connected to one 179 of the cell peripheral gate patterns 179 and 239 through the gate connection patterns 329. The cell active regions 1-CAR and 2-CAR, the cell gate patterns 176 and 236, the cell peripheral gate patterns 179 and 239, the electrode patterns 278, the common node CN, and the peripheral active regions PAR may be repetitively arranged in the cell array region and the peripheral circuit region along the X- and Y-axes of FIG. 2.

Referring to FIG. 6, in order to embody the semiconductor device 330 according to example embodiments, the common node CN may be disposed on the semiconductor substrate 154 as shown in FIG. 2 or 4. The semiconductor substrate 154 may include the cell array region and the peripheral circuit region. The semiconductor substrate 154 may be a semiconductor material comprising Si. The common node CN may be disposed on the semiconductor substrate 154 in the cell array region. The common node CN may extend perpendicularly upward from the semiconductor substrate 154, as shown in FIG. 2. The common node CN may have buffer layers 298, a bistable resistance pattern 303, and/or a conductive plug 307. The buffer layers 298 may comprise metal silicide and be disposed on a sidewall of the bistable resistance pattern 303. The bistable resistance pattern 303 may be interposed between the buffer layers 298 and the conductive plug 307 and surround a sidewall and a bottom surface of the conductive plug 307. The bistable resistance pattern 303 may comprise at least one material that exhibits a low resistance and a high resistance depending on the amount of Joule's heat.

The conductive plug 307 may comprise poly-Si, metal, or metal silicide. The common node connection pattern 309 may be electrically connected to the common node CN and extend parallel to the semiconductor substrate 154. The common node connection pattern 309 may comprise metal. The common node connection pattern 309 may be a bit line in the semiconductor device 330. In the common node CN, the bistable resistance pattern 303 disposed adjacent to the buffer layers 298 may include the resistive memory elements R5, R6, R7, and R8 of FIG. 2. The resistive memory elements R5, R6, R7, and R8 may be data storage elements. The active elements may be disposed to be electrically connected to the common node CN. The active elements may be the first through fourth transistors T1, T2, T3, and T4. The first and second transistors T1 and T2 may be disposed in the first cell body regions 163 and 166 of the first body regions, respectively. The third and fourth transistors T3 and T4 may be disposed in the second cell body regions 224 and 228 of the second body regions, respectively. The first and second body regions may be a semiconductor material comprising Si.

The first through fourth transistors T1, T2, T3, and T4 may comprise the cell active regions 1-CAR and 2-CAR, the cell gate patterns 176 and 236 and cell source and drain regions 192, 196, 197, 199, 252, 256, 257, and 259. The cell source regions 192, 196, 252, and 256 may be electrically connected to the reference connection patterns 278. The reference connection patterns 278 may be source lines which may be connected to a reference voltage. The cell drain regions 197, 199, 257, and 259 may be electrically connected to the common node CN through the buffer layers 298. The cell gate patterns 176 and 236 and the cell source and drain regions 192, 196, 197, 199, 252, 256, 257, and 259 may comprise the same impurity ions. Alternatively, the cell gate patterns 176 and 236 may comprise different impurity ions from the cell source and drain regions 192, 196, 197, 199, 252, 256, 257, and 259. The first and second transistors T1 and T2 may be disposed on lower sides of the common node CN. Also, the third and fourth transistors T3 and T4 may be disposed on upper sides of the common node CN to correspond to the first and second transistors T1 and T2, respectively.

The first and third transistors T1 and T3 may be disposed symmetrically to the second and fourth transistors T2 and T4 with respect to the common node CN and extend in a different direction from the second and fourth transistors T2 and T4. The first through fourth transistors T1, T2, T3, and T4 may extend from a sidewall of the common node CN and be sequentially stacked on the semiconductor substrate 154. The cell gate patterns 176 and 236 of the first and second cell body regions 166 and 228 may be disposed in the first and second body regions, respectively, and extend toward the edge of the cell array region. The first and second cell gate patterns 176 and 236 may comprise the cell peripheral gate patterns 179 and 239, respectively, in the edge of the cell array region. Gate insulating patterns 173 and 233 may be disposed under the cell gate patterns 176 and 236 and the cell peripheral gate patterns 179 and 239. Gate spacers 185 and 245 may be disposed on sidewalls of the cell gate patterns 176 and 236 and the cell peripheral gate patterns 179 and 239. The cell peripheral gate patterns 179 and 239 may be disposed to expose each other in the first and second body regions. The cell peripheral gate patterns 179 and 239 may comprise the same material as the cell gate patterns 176 and 236.

The peripheral body region 169 may be disposed in the first body region of the peripheral circuit region. The peripheral body region 169 may comprise the peripheral active region PAR of the second global transistor GT4 of FIG. 2. The peripheral active region PAR may have a peripheral impurity region 205, which may be one of the source and drain regions of the second global transistor GT4. The first and second global transistors GT3 and GT4 may be disposed at substantially the same level as one of the semiconductor substrate 154 and the second body regions other than the peripheral body region 169. When the first and second global transistors GT3 and GT4 is disposed on the semiconductor substrate 154 in the peripheral circuit region, the peripheral body region 169 of the first body regions may be removed. The peripheral impurity region 205 may comprise the same impurity ions as or different impurity ions from the cell peripheral gate patterns 179 and 239. A pad insulating layer 158, an inter-body insulating layer 215, an electrode insulating layer 265, and a planarized insulating layer 285 may be sequentially disposed between the semiconductor substrate 154 and the common node connection patterns. The pad insulating layer 158 may be interposed between the semiconductor substrate 154 and the first body regions. The inter-body insulating layer 215 may be interposed between the first and second body regions. The electrode insulating layer 265 may be interposed between the second body regions and the electrode patterns 278. The planarized insulating layer 285 may be interposed among the electrode insulating layer 265, the electrode patterns 278 and the common node connection patterns.

The pad insulating layer 158, the inter-body insulating layer 215, the electrode insulating layer 265, and the planarized insulating layer 285 may cover the first and second body regions and the reference connection patterns 278 in the cell array region and the peripheral circuit region and surround the common node CN. A protection insulating layer 315 may be disposed on the planarized insulating layer 285 and cover the common node CN. The gate connection patterns 326 and 329 may be disposed to electrically connect the cell peripheral gate patterns 179 and 239 in the edge of the cell array region to the peripheral body region 169 in the peripheral circuit region. The gate connection patterns 326 and 329 may comprise a conductive material. The gate connection pattern 326 may penetrate the electrode insulating layer 265, the planarized insulating layer 285, and the protection insulating layer 315, and the gate connection pattern 329 may penetrate the inter-body insulating layer 215, the electrode insulating layer 265, the planarized insulating layer 285, and the protection insulating layer 315. The cell peripheral gate pattern 179 of the first body region may be electrically connected to the peripheral impurity region 205 of the peripheral body region 169 through the gate connection pattern 329 as shown in FIG. 2.

Hereinafter, a method of forming a semiconductor device according to example embodiments will be described with reference to the remaining drawings.

FIGS. 7 through 11 are cross-sectional views illustrating a method of forming a semiconductor device taken along lines I-I', II-II', and III-III' of FIG. 3, according to example embodiments.

Referring to FIG. 7, a semiconductor substrate 5 defined by a cell array region and a peripheral circuit region may be prepared according to example embodiments. The semiconductor substrate 5 may be a semiconductor material comprising Si. A pad insulating layer 10 may be formed on the semiconductor substrate 5. The pad insulating layer 10 may be formed in the cell array region and the peripheral circuit region of the semiconductor substrate 5. The pad insulating layer 10 may comprise silicon oxide. A first preliminary body region 20 may be formed on the pad insulating layer 10. The first preliminary body region 20 may be a semiconductor material comprising Si. The first preliminary body region 20 formed in the cell array region may be separated from that formed in the peripheral circuit region. Alternatively, the first preliminary body region 20 formed in the cell array region may be connected with that formed in the peripheral circuit region.

Referring to FIG. 8, first photoresist patterns may be formed on the first preliminary body region 20. The first photoresist patterns may have an 'H' shape that connects the first cell body regions each other (refer to 23 and 26 in FIG. 3) in the cell array region, and have the same shape as the peripheral body region (refer to 29 in FIG. 3) in the peripheral circuit region. The first preliminary body region 20 may be etched using the first photoresist patterns as an etch mask and using the pad insulating layer 10 as an etch buffer layer. After the first preliminary body region 20 is etched, the first photoresist patterns may be removed from the first preliminary body region 20. A first photoresist layer may be formed on the first preliminary body region 20.

The first photoresist layer may have an opening exposing a '-'-shaped central portion of the 'H' shape in the cell array region. A first ion implantation process may be performed on the first preliminary body region 20 using the first photoresist layer as a mask. The first ion implantation process may be performed using selected impurity ions so that a preliminary cell active region 33 can be formed in the '-'-shaped central portion of the 'H' shape in the cell array region. After the preliminary cell active region 33 is formed, the first photoresist layer may be removed from the first preliminary body region 20. Subsequently, a second photoresist layer may be formed on the first preliminary body region 20.

The second photoresist layer may have openings exposing two 'I'-shaped peripheral portions of the 'H' shape in the cell array region. A second ion implantation process may be performed on the first preliminary body region 20 using the second photoresist layer as a mask. The second ion implantation process may be performed using different impurity ions from the first ion implantation process so that cell gate regions 31 and 35 and a cell peripheral gate region 44 can be formed in the 'I'-shaped peripheral portions of the 'H' shape in the cell array region. The cell peripheral gate region 44 may be formed in an edge of the cell array region. After the cell gate regions 31 and 35 and the cell peripheral gate region 44 are formed, the second photoresist layer may be removed from the first preliminary body region 20. Subsequently, a third photoresist layer may be formed on the first preliminary body region 20.

The third photoresist layer may have an opening exposing the first preliminary body region 20 in the peripheral circuit region. A third ion implantation process may be performed on the first preliminary body region 20 using the third photoresist layer as a mask. The third ion implantation process may comprise the same impurity ions as or different impurity ions from the first ion implantation process so that a peripheral impurity region 48 can be formed in the peripheral circuit region. As a result, the first preliminary body region 20 in the peripheral circuit region may define a peripheral active region PAR using the peripheral impurity region 48. After the peripheral impurity region 48 is formed, the third photoresist layer may be removed from the first preliminary body region 20. An inter-body insulating layer 55 may be formed on the pad insulating layer 10 and the first preliminary body region 20. The inter-body insulating layer 55 may comprise the same material as or a different material from the pad insulating layer 10.

Also, the first body region is etched if the global transistors are formed in the substrate.

Figure 9:
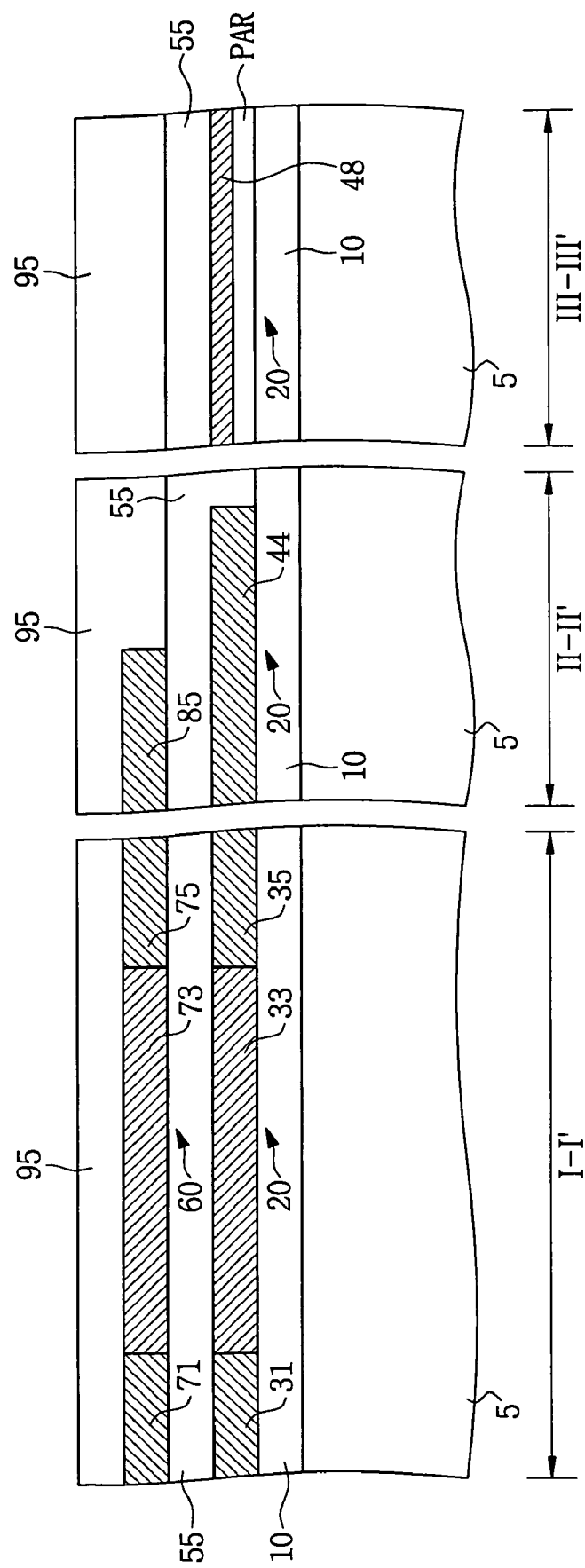

Referring to FIG. 9, a second preliminary body region 60 may be formed on the inter-body insulating layer 55. The second preliminary body region 60 may be formed only in the cell array region. Second photoresist patterns may be formed on the second preliminary body region 60. The second photoresist patterns may have an 'H' shape that connects the second cell body regions each other (refer to 64 and 68 in FIG. 3) in the cell array region. The second preliminary body region 60 may be etched using the photoresist patterns as an etch mask and using the inter-body insulating layer 55 as an etch buffer layer. After the second preliminary body region 60 is etched, the second photoresist patterns may be removed from the second preliminary body region 60. A fourth photoresist layer may be formed on the second preliminary body region 60.

The fourth photoresist layer may have an opening exposing a '-'-shaped central portion of the 'H' shape in the cell array region. A fourth ion implantation process may be performed on the second preliminary body region 60 using the fourth photoresist layer as a mask. The fourth ion implantation process may be performed using selected impurity ions so that a preliminary cell active region 73 can be formed in the '-'-shaped central portion of the 'H' shape in the cell array region. After the preliminary cell active region 73 is formed, the fourth photoresist layer may be removed from the second preliminary body region 60. Subsequently, a fifth photoresist layer may be formed on the second preliminary body region 60.

The fifth photoresist layer may have openings exposing two 'I'-shaped peripheral portions of the 'H' shape in the cell array region. A fifth ion implantation process may be performed on the second preliminary body region 60 using the fifth photoresist layer as a mask. The fifth ion implantation process may be performed using different impurity ions from the fourth ion implantation process so that cell gate regions 71 and 75 and a cell peripheral gate region 85 can be formed in the 'I'-shaped peripheral portions of the 'H' shape in the cell array region. The cell peripheral gate region 85 may be formed in the edge of the cell array region. After the cell gate regions 71 and 75 and the cell peripheral gate region 85 are formed, the fifth photoresist layer may be removed from the second preliminary body region 60. A planarized insulating layer 95 may be formed on the inter-body insulating layer 55 and the second preliminary body region 60. The planarized insulating layer 95 may comprise the same material as the inter-body insulating layer 55.

Figure 10:
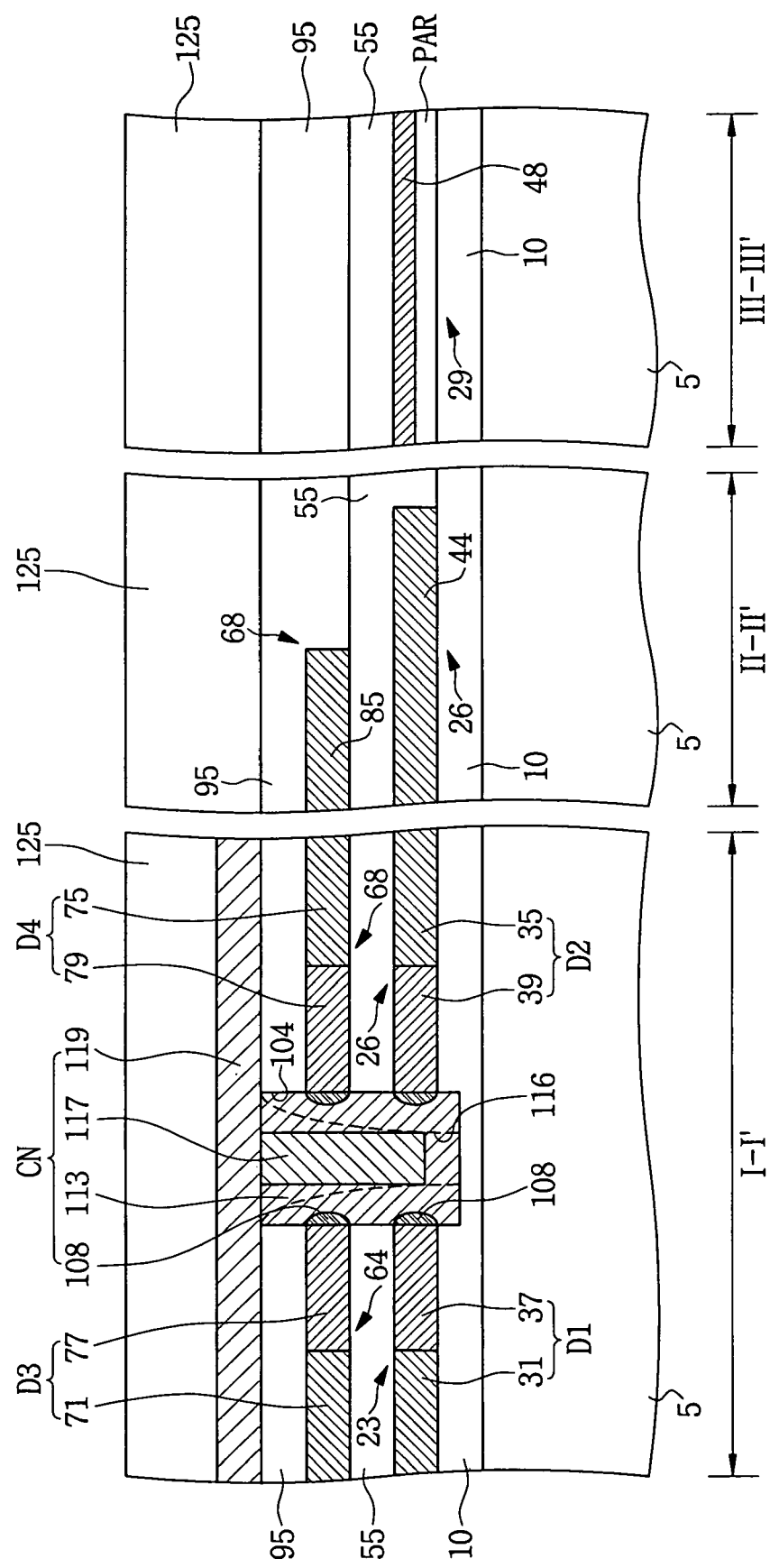

Referring to FIG. 10, a sixth photoresist layer may be formed on the planarized insulating layer 95. The sixth photoresist layer may have an opening in the cell array region. The opening of the sixth photoresist layer may be aligned with the first and second preliminary cell active regions 33 and 73 and expose the planarized insulating layer 95 over the first and second preliminary cell active regions 33 and 73, in the cell array region. The planarized insulating layer 95, the second preliminary body region 60, the inter-body insulating layer 55, the first preliminary body region 20 and a portion of the pad insulating layer 10 may be sequentially etched using the sixth photoresist layer as an etch mask, thereby forming a through hole 104. The through hole 104 may separate the first and second preliminary body regions 20 and 60 in the cell array region so that first and second body regions may be formed in the cell array region and the peripheral circuit region. The first body regions may comprise the first cell body regions 23 and 26 in the cell array region and the peripheral body region 29 in the peripheral circuit region. The second body regions may comprise the second cell body regions 64 and 68 in the cell array region.

The first cell body region 23 may form an active element comprising the cell gate region 31 and a cell active region 37 for example, a first diode D1. The first cell body region 26 may form an active element comprising the cell gate region 35 and a cell active region 39 for example, a second diode D2. The first cell body region 26 may further comprise the cell peripheral gate region 44 in the edge of the cell array region. The second cell body region 64 may form a third diode D3 comprising the cell gate region 71 and a cell active region 77. The second cell body region 68 may form an active element comprising the cell gate region 75 and a cell active region 79, for example, a fourth diode D4. The second cell body region 68 may further comprise the cell peripheral gate region 85 in the edge of the cell array region. The through hole 104 may be formed to expose the first and second cell active regions 37, 39, 77, and 79. A diameter of the through hole 104 may be greater in size than each of the widths of the first and second preliminary body regions 20 and 60. After the through hole 104 is formed, the sixth photoresist layer may be removed from the planarized insulating layer 95.

Buffer layers 108 may be formed in the through hole 104 on the first and second cell active regions 37, 39, 77, and 79. The buffer layers 108 may comprise metal silicide. A bistable resistance pattern 113 and a conductive plug 117 may be sequentially formed to fill the through hole 104. The bistable resistance pattern 113 may be formed to conformably cover the through hole 104. The bistable resistance pattern 113 may be formed to have the resistive memory elements (refer to R1, R2, R3, and R4 in FIG. 1) adjacent to the buffer layers 108. Alternatively, bistable resistance pattern may be formed as a spacer shape 116 on a sidewall of the through hole 104. A bistable resistance material of the bistable resistance pattern 113 may comprise one selected from the group consisting of phase-change material, conductive multilayer material, metallic oxide, and nano-material dot. The phase-change material may be chalcogenide comprising one of germanium (Ge), antimony (Sb), and tellurium (Te).

The conductive multilayer material may include conductive molecule, metallic crystals, and conductive molecule which are sequentially stacked. The conductive molecule may comprise one selected from poly(N-vinylcarbazole) (PVK) and 2-Amino-4, 5-Imidazoledicarbonitrile (AIDCN). The metallic oxide may comprise compound of at least one selected from the group consisting of zirconium (Zr), titanium (Ti), tellurium (Te), strontium (Sr), antimony (Sb), praseodymium (Pr), niobium (Nb), nickel (Ni), manganese (Mn), germanium (Ge), selenium (Se), chromium (Cr), calcium (Ca), aluminum (Al) and silver (Ag), and oxygen (O). Also, the nano-material dot may comprise one selected from the group consisting of silicon (Si), gold (Au), cobalt (Co), and tungsten (W). The conductive plug 117 may comprise one selected from the group consisting of poly-Si, metal, and metal nitride.

The buffer layers 108, the bistable resistance pattern 113, and the conductive plug 117 may constitute the inner common node ICN of FIG. 1. A bit line 119 formed on the planarized insulating layer 95 may be electrically connected to the inner common node ICN. The bit line 119 may form the outer common node OCN of FIG. 1. The outer common node OCN may comprise metal. The inner and outer common nodes ICN and OCN may constitute a common node CN. A protection insulating layer 125 may be formed on the planarized insulating layer 95 and the common node CN. The protection insulating layer 125 may comprise the same material as the planarized insulating layer 95.

Figure 11:
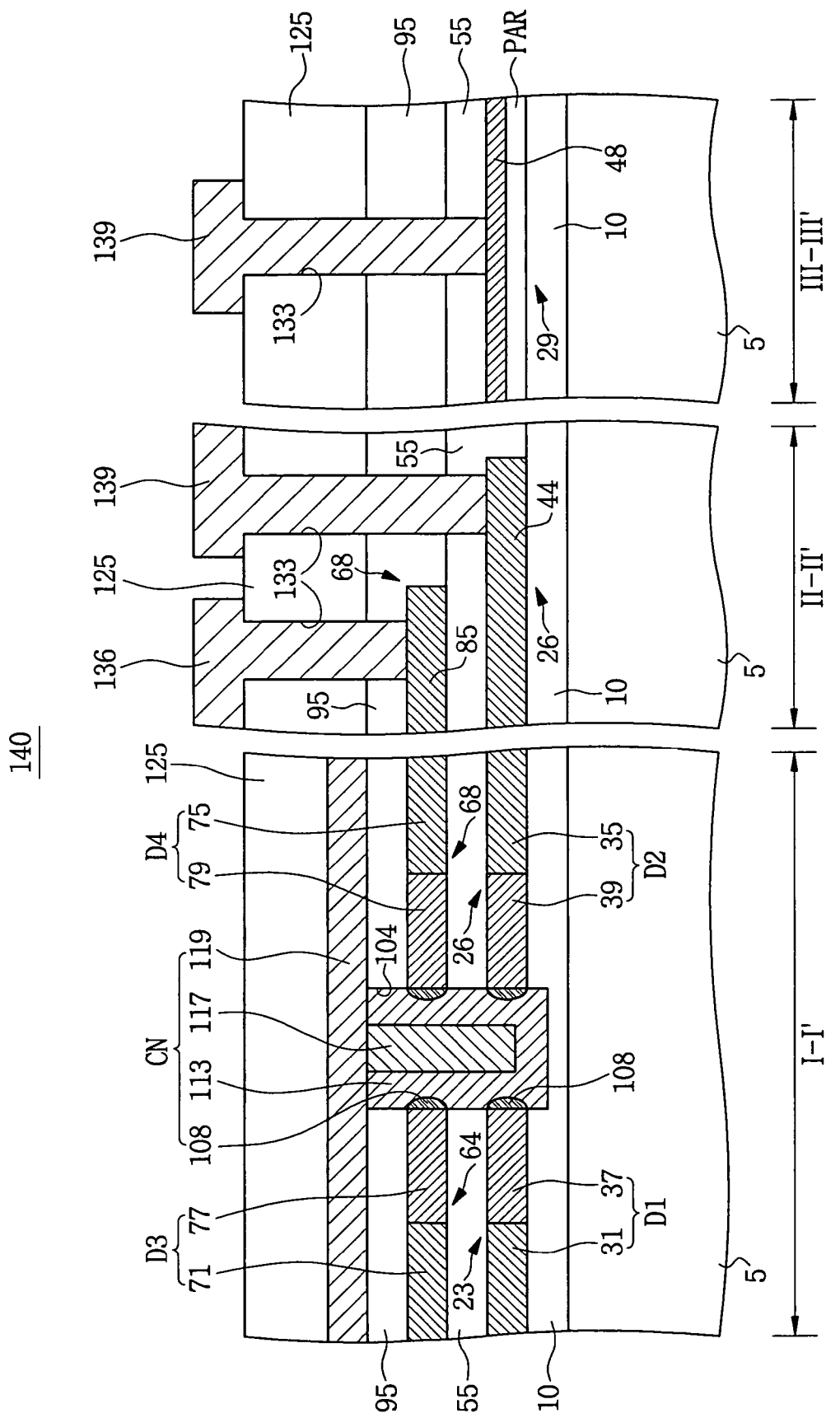

Referring to FIG. 11, a seventh photoresist layer may be formed on the protection insulating layer 125. The seventh photoresist layer may have openings exposing the protection insulating layer 125 in the edge of the cell array region and in the peripheral circuit region. The inter-body insulating layer 55, the planarized insulating layer 95, and the protection insulating layer 125 may be etched using the seventh photoresist layer as an etch mask and using the first and second body regions as an etch buffer layer, thereby forming connection holes 133. The connection holes 133 may be formed to expose the peripheral gate regions 44 and 85 and the peripheral impurity region 48 through the inter-body insulating layer 55, the planarized insulating layer 95, and the protection insulating layer 125. After the connection holes 133 are formed, the seventh photoresist layer may be removed from the protection insulating layer 125. Gate connection patterns 136 and 139 may be formed on the protection insulating layer 125 to fill the connection holes 133. Gate connection patterns 136 and 139 may include plugs to fill the connection holes 133.

The gate connection patterns 136 and 139 may comprise conductive material. The cell peripheral gate region 44 in the first cell body region 26 may be electrically connected to the peripheral impurity region 48 in the peripheral body region 29 through the gate connection patterns 139. The peripheral impurity region 48 may be a source region or a drain region of the global transistor GT2 of FIG. 1. Patterns 136 and 139, the first and second body regions, the common node CN, and the global transistor GT2 may constitute a semiconductor device 140 according to example embodiments. In modifications of example embodiments, third cell body regions may be further formed between the second cell body regions 64 and 68 and the outer common node OCN. The third cell body regions may have the same structure as the second cell body regions 64 and 68 and be electrically connected to the common node CN.

The semiconductor device 140 of example embodiments may be one electrical device selected from a plurality of resistive memories, e.g., a phase-change random access memory (PRAM), a polymer random access memory (PoRAM), a resistance random access memory (ReRAM), and a nano-floating gate memory (NFGM), according to a material constituting the bistable resistance pattern 113. A PRAM device may use the bistable resistance pattern 113 corresponding to the phase-change material. A PoRAM device may use the bistable resistance pattern 113 corresponding to the conductive multilayer material. A ReRAM device may use the bistable resistance pattern 113 corresponding to the phase-change material or metallic oxide. Also, an NFGM device may use the bistable resistance material 113 corresponding to the nano-material dot. As a result, the semiconductor device 140 according to example embodiments may use the bistable resistance pattern 113 to embody a nonvolatile memory device.

FIGS. 12 through 18 are cross-sectional views illustrating a method of forming a semiconductor device taken along lines I-I', II-II', and III-III' of FIG. 4, according to example embodiments.

Figure 12:
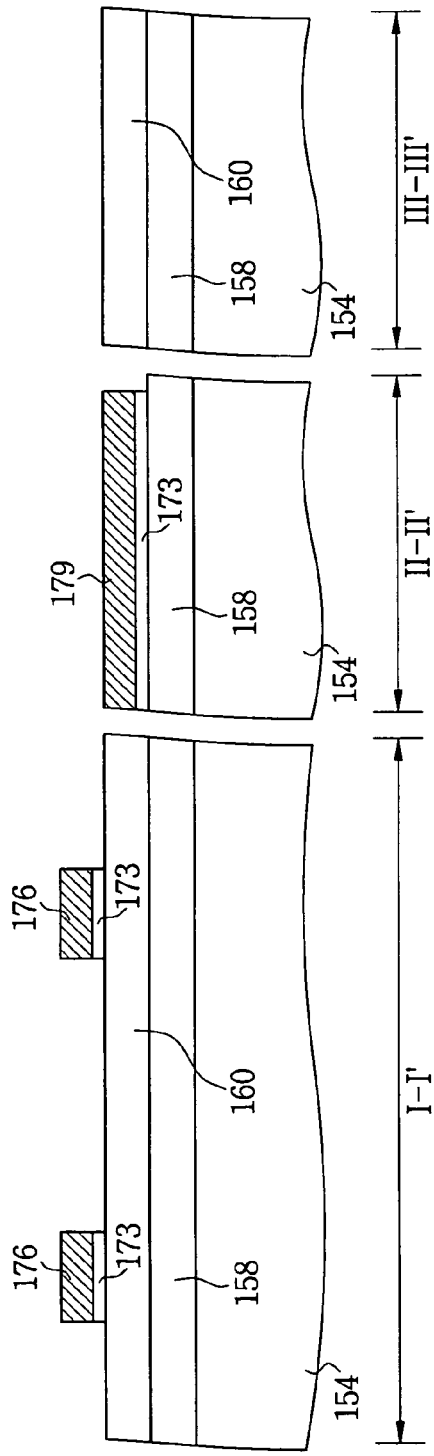
FIGS. 12 through 18 are cross-sectional views illustrating a method of forming a semiconductor device taken along lines I-I', II-II', and III-III' of FIG. 4.

Referring to FIG. 12, a semiconductor substrate 154 defined by a cell array region and a peripheral circuit region may be prepared according to example embodiments. The semiconductor substrate 154 may be a semiconductor material comprising Si. A pad insulating layer 158 may be formed on the semiconductor substrate 154. The pad insulating layer 158 may be formed in the cell array region and the peripheral circuit region of the semiconductor substrate 154. The pad insulating layer 158 may be formed of a silicon oxide. A first preliminary body region 160 may be formed on the pad insulating layer 158. The first preliminary body region 160 may form in a ribbon shape or fillet shape as the CARs of FIG. 4. The first preliminary body region 160 may be semiconductor material comprising Si. The first preliminary body region 160 formed in the cell array region may be separated from that formed in the peripheral circuit region. The first preliminary body region 160 formed in the cell array region may be connected with that formed in the peripheral circuit region. The first preliminary body region 160 may be formed in an edge of the cell array region. Cell gate patterns 176 may be formed on the first preliminary body region 60 formed in the cell array region. The cell gate patterns 176 may comprise conductive material.

One of the cell gate patterns 176 may extend toward the edge of the cell array region and form a cell peripheral gate pattern 179 in the edge of the cell array region. Accordingly, the cell gate patterns 176 and the cell peripheral pattern 179 may comprise the same impurity ions. Gate insulating patterns 173 may be respectively formed under the cell gate patterns 176 and the cell peripheral gate pattern 179. The gate insulating patterns 173 may be insulating material comprising silicon oxide.

Figure 13:
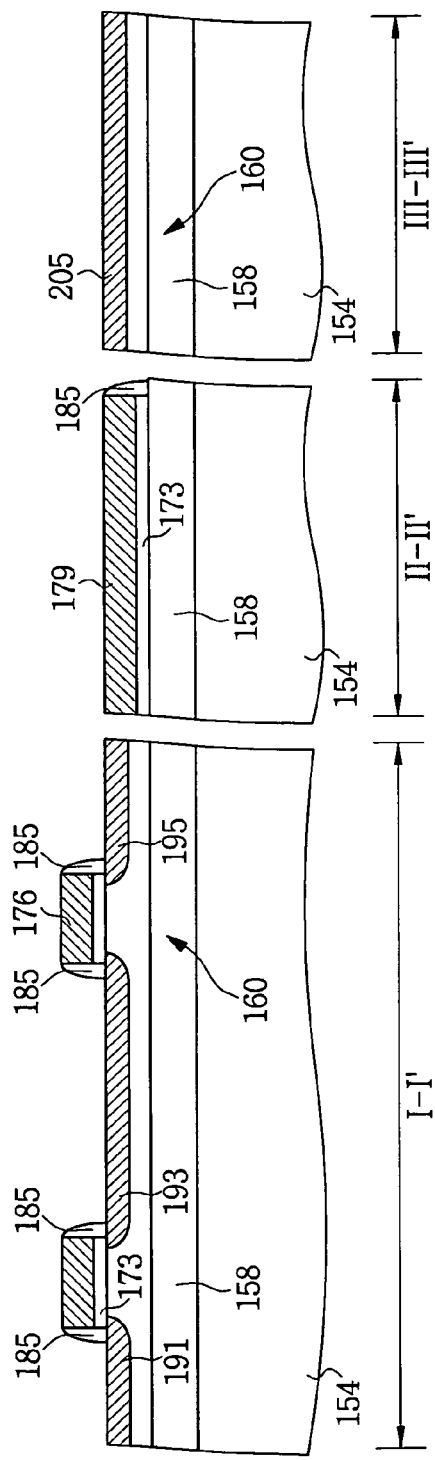

Referring to FIG. 13, gate spacers 185 may be formed on sidewalls of the cell gate patterns 176 and the cell peripheral gate pattern 179. The gate spacers 185 may comprise the same material as or a different material from the gate insulating patterns 173. A first photoresist layer may be formed on the pad insulating layer 158 and the first preliminary body region 160 to cover the peripheral circuit region and expose the cell array region. A first ion implantation process may be performed on the first preliminary body region 160 in the cell array region using the first photoresist layer as a mask. The first ion implantation process may be performed using selected impurity ions so that preliminary cell source regions 191 and 195 and a preliminary cell drain region 193 can be formed in the first preliminary body region 160 formed in the cell array region. The preliminary cell source and drain regions 191, 193, and 195 may comprise the same impurity ions as or different impurity ions from the cell gate patterns 176. The preliminary cell source and drain regions 191, 193, and 195 may overlap the cell gate patterns 176.

After the preliminary cell source and drain regions 191, 193, and 195 are formed, the first photoresist layer may be removed from the pad insulating layer 158 and the first preliminary body region 160. Subsequently, a second photoresist layer may be formed on the pad insulating layer 158 and the first preliminary body region 160 to cover the cell array region and expose the peripheral circuit region. A second ion implantation process may be performed on the first preliminary body region 160 formed in the peripheral circuit region using the second photoresist layer as a mask. The second ion implantation process may be performed using the same impurity ions as or different impurity ions from the first ion implantation process so that a peripheral impurity region 205 can be formed in the first preliminary body region 160 in the peripheral circuit region. The peripheral impurity region 205 may be a source region or a drain region of the global transistor GT4 of FIG. 2. After the peripheral impurity region 205 is formed, the second photoresist layer may be removed from the pad insulating layer 158 and the first preliminary body region 160.

Figure 14:
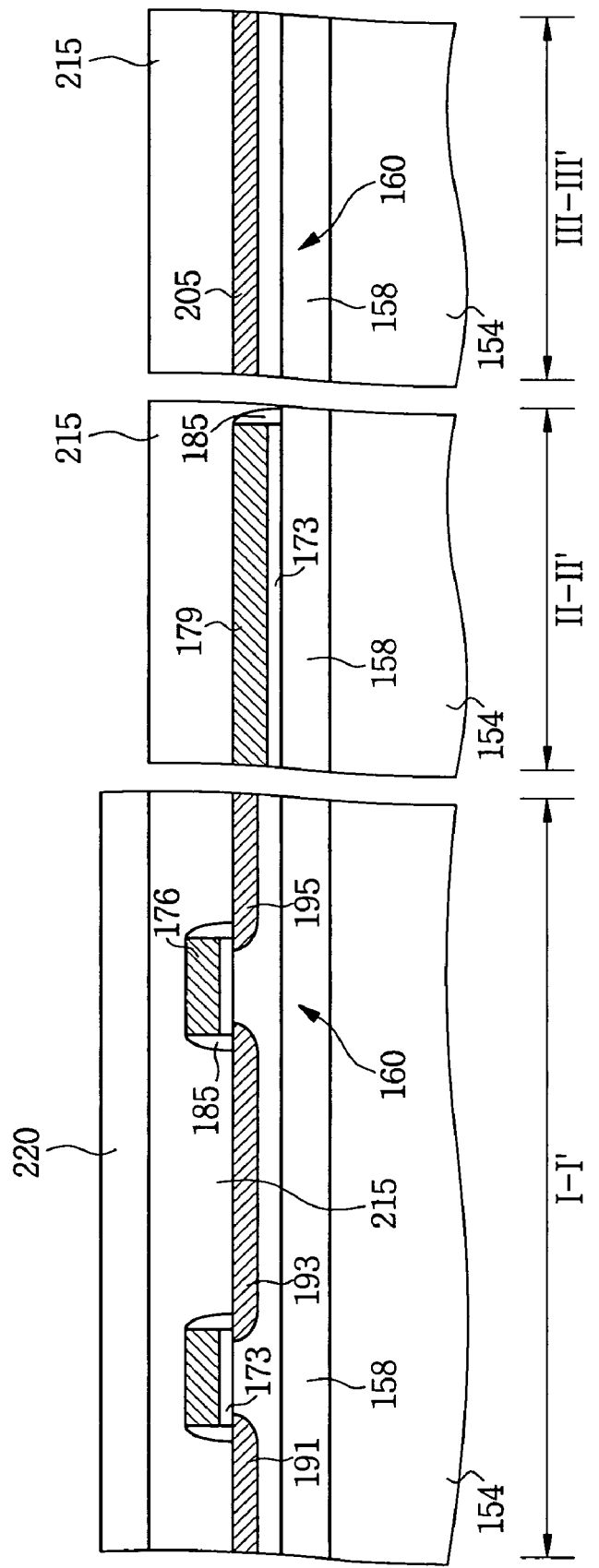
Figure 15:
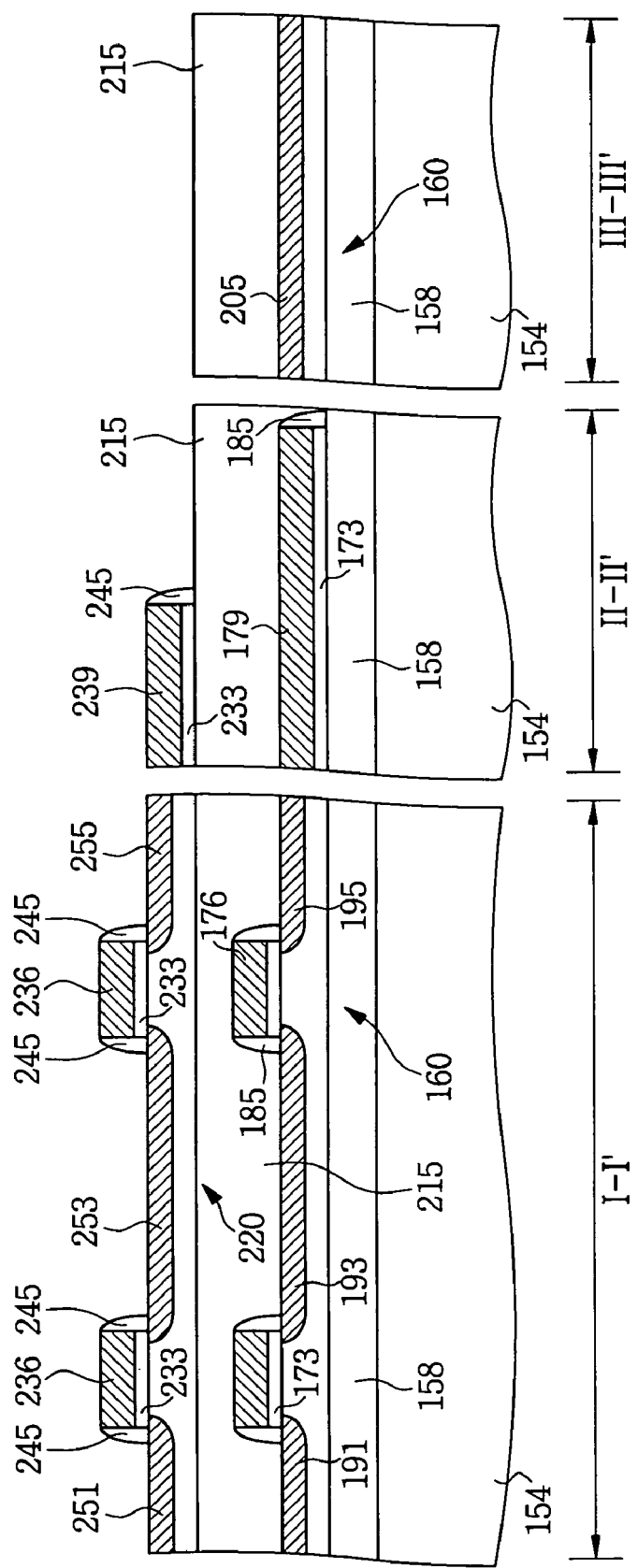

Referring to FIGS. 14 and 15, an inter-body insulating layer 215 may be formed on the pad insulating layer 158 and the first preliminary body region 160 as shown in FIG. 14 to cover the cell gate patterns 176 and the cell peripheral gate pattern 179. The inter-body insulating layer 215 may comprise the same material as the pad insulating layer 158. A second preliminary body region 220 may be formed on the inter-body insulating layer 215 as shown in FIG. 14. The second preliminary body region 220 may be formed in a ribbon shape or fillet shape as CARs of FIG. 4. The second preliminary body region 220 may comprise the same material as the first preliminary body region 160. The second preliminary body region 220 may not be formed in the edge of the cell array region and in the peripheral circuit region. Cell gate patterns 236 may be formed on the second preliminary body region 220 formed in the cell array region as shown in FIG. 15. The cell gate patterns 236 may comprise conductive material. One of the cell gate patterns 236 may extend toward the edge of the cell array region and form a cell peripheral gate pattern 239 in the edge of the cell array region.

The cell gate patterns 236 and the cell peripheral gate pattern 239 may comprise the same impurity ions. The cell gate patterns 236 and the cell peripheral gate pattern 239 in the second preliminary body region 220 may comprise the same impurity ions as the cell gate patterns 176 and the cell peripheral gate pattern 179 formed in the first preliminary body region 160. Gate insulating patterns 233 may be respectively formed under the cell gate patterns 236 and the cell peripheral gate pattern 239 as shown in FIG. 15. The gate insulating patterns 233 in the second preliminary body region 220 may comprise the same material as or different material from the gate patterns 173 in the first preliminary body region 160. Gate spacers 245 may be formed on sidewalls of the cell gate patterns 236 and the cell peripheral gate pattern 239 as shown in FIG. 15. The gate spacers 245 may comprise the same material as or different material from the gate insulating patterns 233.

A third photoresist layer may be formed on the inter-body insulating layer 215 and the second preliminary body region 220 to cover the peripheral circuit region and expose the cell array region. A third ion implantation process may be performed on the second preliminary body region 220 formed in the cell array region using the third photoresist layer as a mask. The third ion implantation process may be performed using selected impurity ions so that preliminary cell source regions 251 and 255 and a preliminary cell drain region 253 can be formed in the second preliminary body region 220 of the cell array region as shown in FIG. 15. The preliminary cell source and drain regions 251, 253, and 255 may comprise the same impurity ions as or different impurity ions from the cell gate patterns 236. The preliminary cell source and drain regions 251, 253, and 255 may overlap the cell gate patterns 236. After the preliminary cell source and drain regions 251, 253, and 255 are formed, the third photoresist layer may be removed from the inter-body insulating layer 215 and the second preliminary body region 220.

Figure 16:
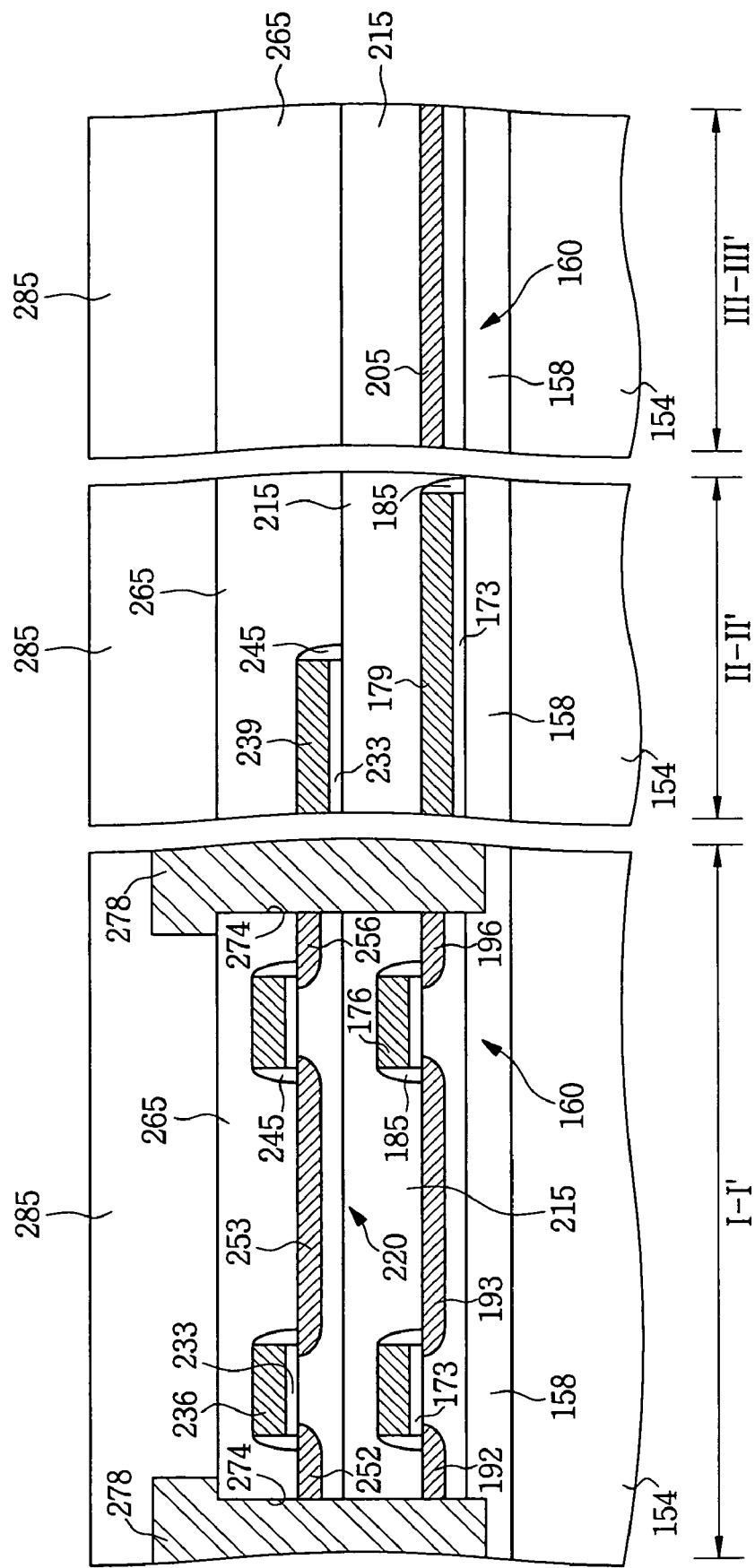

Referring to FIG. 16, an electrode insulating layer 265 may be formed on the inter-body insulating layer 215 and the second preliminary body region 220 to cover the cell gate patterns 236 and the cell peripheral gate pattern 239. The electrode insulating layer 265 may comprise the same material as the inter-body insulating layer 215. A fourth photoresist layer may be formed on the electrode insulating layer 265. The fourth photoresist layer may have openings, which are aligned with the preliminary cell source regions 191, 195, 251, and 255 of FIG. 15 and expose the electrode insulating layer 265. The electrode insulating layer 265, the second preliminary body region 220, the inter-body insulating layer 215, and the first preliminary body region 160 may be sequentially etched using the fourth photoresist layer as an etch mask, thereby forming electrode holes 274 in the pad insulating layer 158. A diameter of the electrode holes 274 may be greater in size than each of widths of the first and second preliminary body regions 160 and 220. As a result, the electrode holes 274 may primarily separate each of the first and second preliminary body regions 160 and 220 into portions.

The electrode holes 274 may be formed to expose the first and second preliminary body regions 160 and 220. The electrode holes 274 may form cell source regions 192, 196, 252, and 256 in the first and second preliminary body regions 160 and 220. The cell source regions 192, 196, 252, and 256 may be exposed by the electrode holes 274. After the electrode holes 274 are formed, the fourth photoresist layer may be removed from the electrode insulating layer 265. Electrode patterns 278 may be formed on the electrode insulating layer 265 to fill the electrode holes 274, respectively. The electrode patterns 278 may comprise conductive material. A planarized insulating layer 285 may be formed on the electrode insulating layer 265 to cover the electrode patterns 278. The planarized insulating layer 285 may comprise the same material as the electrode insulating layer 265.

Figure 17:
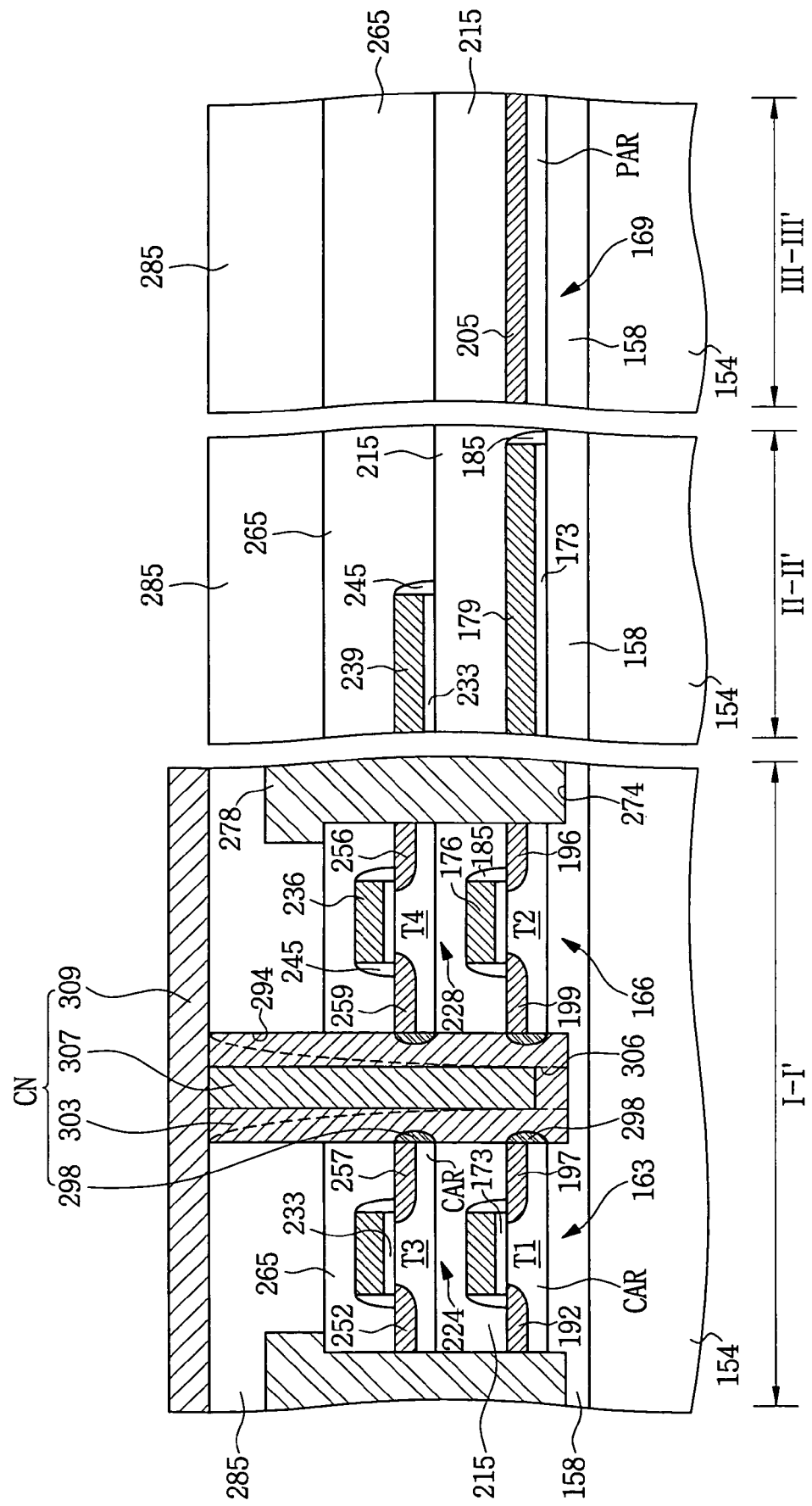

Referring to FIG. 17, a fifth photoresist layer may be formed on the planarized insulating layer 285. The fifth photoresist layer may have openings, which are aligned with the preliminary cell drain regions 193 and 253 of FIG. 16 and expose the planarized insulating layer 285. The planarized insulating layer 285, the electrode insulating layer 265, the second preliminary body region 220, the inter-body insulating layer 215, and the first preliminary body region 160 may be sequentially etched using the fifth photoresist layer as an etch mask, thereby forming a through hole 294 in the pad insulating layer 158. A diameter of the through hole 294 may be greater in size than each of widths of the first and second preliminary body regions 160 and 220. As a result, the through hole 294 may secondarily separate each of the first and second preliminary body regions 160 and 220 into portions. That is, the through hole 294 and the electrode holes 274 may separate the first and second preliminary body regions 160 and 220 into first and second body regions on the semiconductor substrate 154. The first body regions may comprise first cell body regions 163 and 166 and a peripheral body region 169. The second body regions may comprise second cell body regions 224 and 228.

In the first cell body regions 163 and 166, the gate patterns 176 on cell active regions CAR and the cell source regions 192 and 196 and cell drain regions 197 and 199 in the cell active regions CAR may constitute active elements, for example, first and second transistors T1 and T2. In the second cell body regions 224 and 228, the gate patterns 236 on the cell active regions CAR and the cell source regions 252 and 256 and cell drain regions 257 and 259 in the cell active regions CAR may constitute active elements, for example, third and fourth transistors T3 and T4. The cell drain regions 197, 199, 257, and 259 may be exposed by the through hole 294. After the through hole 294 is formed, the fifth photoresist layer may be removed from the planarized insulating layer 285. Buffer layers 298 may be formed through the through holes 294 on the cell drain regions 197, 199, 257, and 259. The buffer layers 298 may comprise the same material as the buffer layer 108 described with reference to FIG. 10. A bistable resistance pattern 303 may be formed on the buffer layers 298 to conformably cover the through hole 294. The bistable resistance pattern 303 may comprise the same material as the bistable resistance pattern 113 described with reference to FIG. 10.

Alternatively, bistable resistance spacers 306 may be formed on a sidewall of the through hole 294 instead of the bistable resistance pattern 303. A conductive plug 307 may be formed on the bistable resistance pattern 303 to fill the through hole 294. The conductive plug 307 may comprise the same material as the conductive plug 117 described with reference to FIG. 10. The buffer layers 298, the bistable resistance pattern 303, and the conductive plug 307 may constitute the inner common node ICN of FIG. 2. A bit line 309 may be formed on the planarized insulating layer 285 to be electrically connected to the inner common node ICN. The bit line 309 may constitute the outer common node OCN of FIG. 2. The outer common node OCN may comprise the same material as in FIG. 10. The inner and outer common nodes ICN and OCN may constitute a common node CN.

Figure 18:
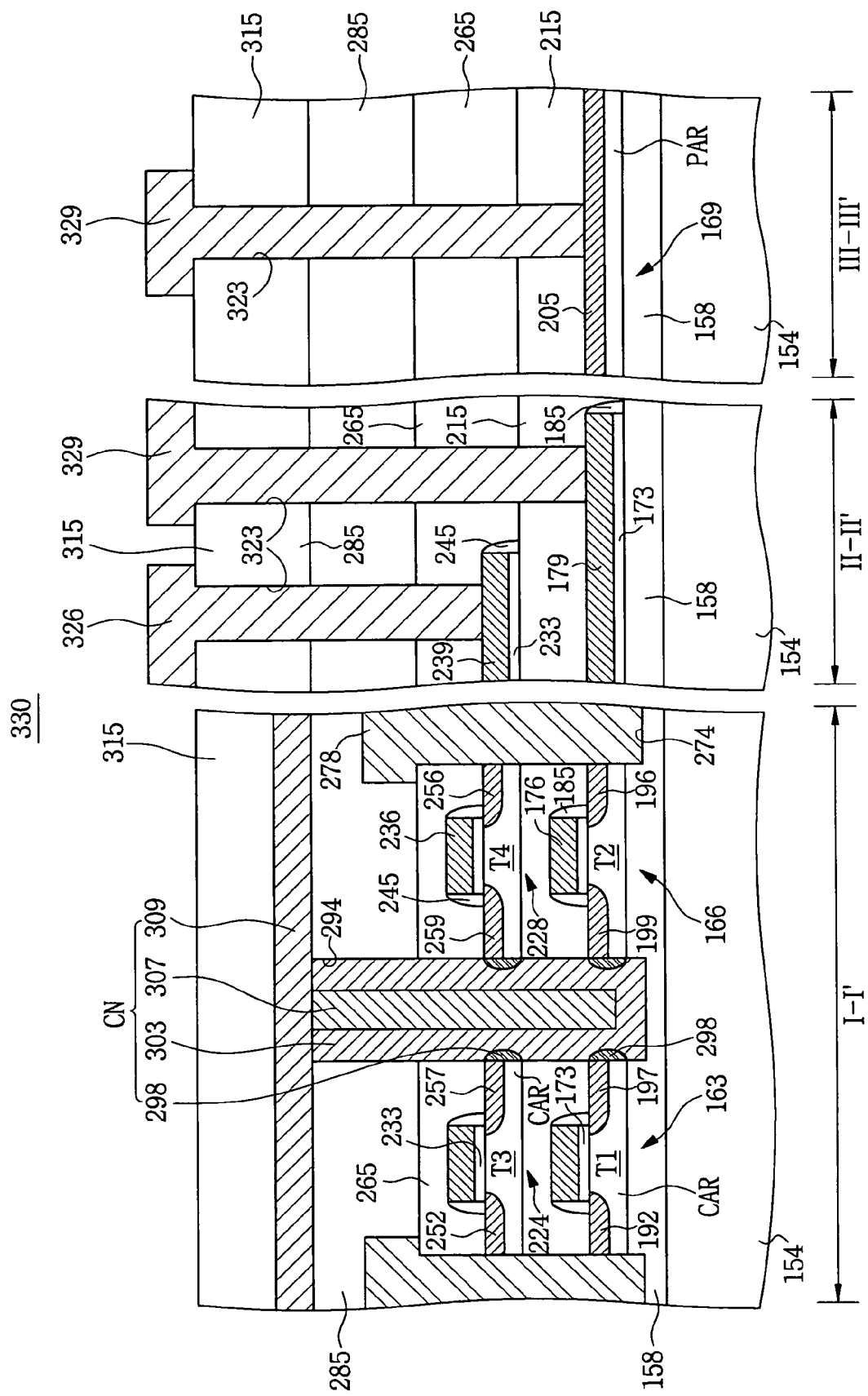

Referring to FIG. 18, a protection insulating layer 315 may be formed on the planarized insulating layer 285 to cover the common node CN. The protection insulating layer 315 may comprise the same material as the planarized insulating layer 285. A sixth photoresist layer may be formed on the protection insulating layer 315. The sixth photoresist layer may have openings exposing the protection insulating layer 315 in the edge of the cell array region and in the peripheral circuit region. The inter-body insulating layer 215, the electrode insulating layer 265, the planarized insulating layer 285, and the protection insulating layer 315 may be etched using the sixth photoresist layer as an etch mask and using the first and second body regions as an etch buffer layer, thereby forming connection holes 323. The connection holes 323 may be formed to expose the peripheral gate patterns 179 and 239 and the peripheral impurity region 205 through the inter-body insulating layer 215, the electrode insulating layer 265, the planarized insulating layer 285, and the protection insulating layer 315. After the connection holes 323 are formed, the sixth photoresist layer may be removed from the protection insulating layer 315. Gate connection patterns 326 and 329 may be formed on the protection insulating layer 315 to fill the connection holes 323.

The gate connection patterns 326 and 329 may comprise the same material as the gate connection patterns 136 and 139 described with reference to FIG. 11. The cell peripheral gate pattern 179 in the first cell body region 166 may be electrically connected to the peripheral impurity region 205 in the peripheral body region 169 through the gate connection pattern 329. The peripheral impurity region 205 may be a source region or a drain region of the global transistor GT4 of FIG. 2. The gate connection patterns 326 and 329, the first and second body regions, the common node CN, and the global transistor GT4 may constitute a semiconductor device 330 according to the second example embodiment. In modifications of example embodiments, third cell body regions may be further formed among the second cell body regions 224 and 228 and the outer common node OCN. The third cell body regions may comprise the same structure as the second cell body regions 224 and 228 and be electrically connected to the common node CN.

The semiconductor device 330 of example embodiments may be an electrical device selected from a plurality of resistive memories, e.g., a PRAM, a PoRAM, a ReRAM, and an NFGM, according to a material constituting the bistable resistance pattern 303. A PRAM device may use the bistable resistance pattern 303 corresponding to a phase-change material. A PoRAM device may use the bistable resistance pattern 303 corresponding to a conductive multilayer material. A ReRAM device may use the bistable resistance pattern 303 corresponding to a phase-change material or metallic oxide. Also, an NFGM device may use the bistable resistance material 303 corresponding to a nano-material dot. As a result, the semiconductor device 330 according to example embodiments may use the bistable resistance pattern 303 to embody a nonvolatile memory device.

According to example embodiments, methods of reducing step differences between a semiconductor substrate and structures by disposing a common node perpendicular to the semiconductor substrate and forming active elements parallel to the semiconductor substrate are provided. As a result, as the number of the structures stacked on the semiconductor substrate increases, the step differences between the semiconductor substrate and the structures stacked on the semiconductor substrate can be reduced as compared with conventional techniques. Therefore, conditions of a semiconductor fabrication process can be ameliorated.

Furthermore, a common node may be electrically connected to selected active elements, and resistive memory elements may be disposed in the common node so that memory cells can be provided in an equal number to the selective active elements using the common node and the selected active elements. Accordingly, a nonvolatile memory device in which memory cells are more highly integrated on a semiconductor substrate may be provided.

Figure 19:
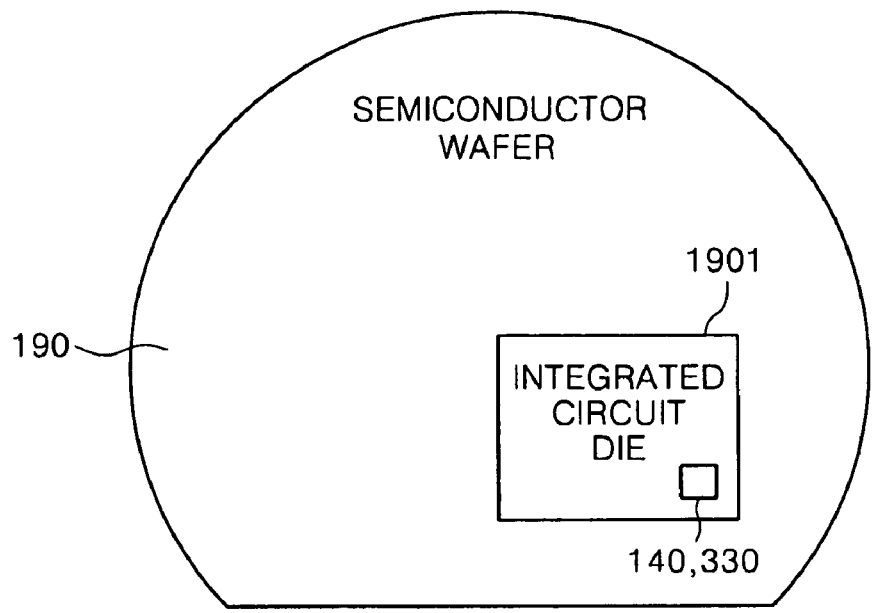
FIG. 19 is a diagram of a semiconductor wafer including semiconductor memory device according to example embodiments.

FIG. 19 is a diagram of a semiconductor wafer including semiconductor memory device according to example embodiments. As shown in FIG. 19, a semiconductor wafer 190 includes a yet-to-be cut integrated circuit die 1901 that incorporates the semiconductor memory device 140 of FIG. 1 or 330 of FIG. 2. It may become easier to cut the semiconductor wafer because the integrated circuit die is thinner than other stacked memory devices.

Figure 20:
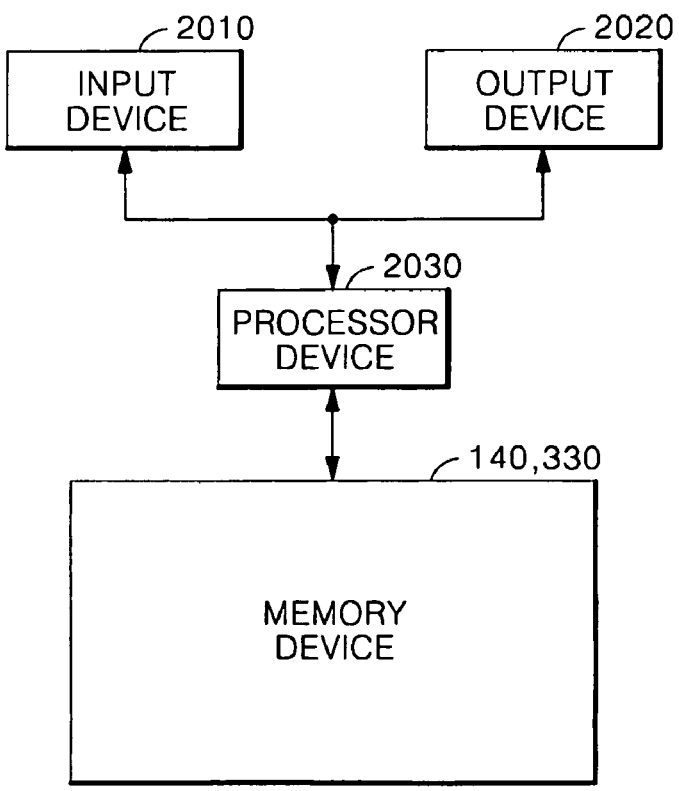
FIG. 20 is a block diagram of an electronic system including a memory device according example embodiments.

FIG. 20 is a block diagram of an electronic system including a memory device according example embodiments. As shown in FIG. 20, an electronic system 200 includes an input device 2010, an output device 2020 and/or a memory device 140 (330), all coupled to a processor device 2030. The memory device 140 (330) may be one of the memory devices 140 of FIG. 1 or 330 of FIG. 2. The electronic system 200 may become smaller and lighter because the memory device according to example embodiments has higher density than other memory devices using one semiconductor substrate.

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims.

What is claimed is:

1. A semiconductor device comprising:
   a semiconductor substrate having a cell array region and a peripheral circuit region;
   a common node on the semiconductor substrate in the cell array region and including resistive memory elements, the common node extending perpendicularly upward from the semiconductor substrate;
   first and second active elements electrically connected to the common node, extending from a sidewall of the common node, and sequentially stacked on the semiconductor substrate; and
   an insulating layer disposed on the semiconductor substrate, surrounding the common node and interposed between the first and second active elements, wherein the common node includes,
      a conductive plug;
      a bistable resistance pattern surrounding a sidewall and a bottom surface of the conductive plug; and
      buffer layers disposed on a sidewall of the bistable resistance pattern,
         wherein the resistive memory elements are disposed in the bistable resistance pattern adjacent to the buffer layer.

2. The semiconductor device of claim 1, wherein the conductive plug comprises one selected from the group consisting of polysilicon, metal, and metal nitride, the bistable resistance pattern comprises one selected from the group consisting of phase-change material, conductive multilayer material, metallic oxide, and nano-material dot, the buffer layers comprise metal silicide, and the outer common node comprises metal to be electrically connected to the conductive plug and the bistable resistance pattern.

3. The semiconductor device of claim 2, wherein the phase-change material is chalcogenide comprising germanium (Ge), antimony (Sb), and tellurium (Te), the conductive multilayer material comprises conductive molecule, metallic crystals, and conductive molecule that are sequentially stacked, and the conductive molecules comprise one selected from poly(N-vinylcarbazole) (PVK) and 2-Amino-4,5-Imidazoledicarbonitrile (AIDCN).

4. The semiconductor device of claim 3, wherein the metallic oxide comprises compound of at least one selected from the group consisting of zirconium (Zr), titanium (Ti), tellurium (Te), strontium (Sr), antimony (Sb), praseodymium (Pr), niobium (Nb), nickel (Ni), manganese (Mn), germanium (Ge), selenium (Se), chromium (Cr), calcium (Ca), aluminum (Al), and silver (Ag), and oxygen (O), and the nano-material dot comprises one selected from the group consisting of silicon (Si), gold (Au), cobalt (Co), and tungsten (W).

5. The semiconductor device of claim 4, further comprising at least one third active element electrically connected to the common node and disposed on the second active element,
wherein each of the first through third active elements is one selected from a diode and a transistor.

6. The semiconductor device of claim 5, wherein when the first through third active elements are the diodes, each of the first through third active elements comprises a cell gate region and a cell active region disposed in a first body region, the cell gate region is electrically connected to a first side of the cell active region and runs perpendicular to the first side of the cell active region, a second side of the cell active region is in contact with one of the buffer layers, the cell gate region and the cell active region comprise different impurity ions, and a width of the common node is greater in size than a width of the cell active region.

7. The semiconductor device of claim 6, further comprising:
cell peripheral gate regions disposed to respectively correspond to the cell gate regions of the first through third active elements in an edge of the cell array region, the cell peripheral gate regions being electrically connected to the cell gate regions of the first through third active elements, respectively; and
first global transistors disposed in the peripheral circuit region,
wherein the cell peripheral gate regions are sequentially stacked to partially expose one another in the edge of the cell array region, the cell peripheral gate regions are electrically connected to the first global transistors, respectively, the cell peripheral gate regions comprise the same impurity ions as the cell gate region, and the first global transistors are disposed at substantially the same level as one of the first through third active elements and the semiconductor substrate.

8. The semiconductor device of claim 7, further comprising:
fourth active elements disposed opposite to the first through third active elements with respect to the common node and respectively corresponding to the first through third active elements; and
second global transistors electrically connected to the fourth active elements, respectively, in the peripheral circuit region,
wherein the peripheral impurity regions comprise the same impurity ions as or different impurity ions from the cell peripheral gate regions, the fourth active elements comprise the same structure as the first through third active elements, and the first through fourth active elements, the cell peripheral gate regions, the common node, and the first and second global transistors are 2-dimensionally disposed on the semiconductor substrate in the cell array region and the peripheral circuit region.

9. The semiconductor device of claim 5, wherein when the first through third active elements are transistors, each of the first through third active elements comprises a cell gate pattern disposed on a first body region and cell source and drain regions disposed in the first body region and overlapping the cell gate pattern, and the cell source region is in contact with an electrode pattern, the cell drain region is in contact with one selected from the buffer layers, and a width of the common node is greater in size than a width of the first body region.

10. The semiconductor device of claim 9, further comprising:
cell peripheral gate patterns disposed to respectively correspond to the cell gate patterns of the first through third active elements in an edge of the cell array region, the cell peripheral gate patterns being electrically connected to the cell gate patterns of the first through third active elements, respectively; and
first global transistors disposed in the peripheral circuit region and having peripheral impurity regions disposed in a second body region,
wherein the cell peripheral gate patterns are sequentially stacked to partially expose one another in the edge of the cell array region, the cell peripheral gate patterns are electrically connected to the peripheral impurity regions, respectively, the cell peripheral gate patterns comprise the same impurity ions as the cell gate patterns, and the first global transistors are disposed at substantially the same level as one of the first through third active elements and the semiconductor substrate.

11. The semiconductor device of claim 10, further comprising:
fourth active elements disposed opposite to the first through third active elements with respect to the common node and respectively corresponding to the first through third active elements; and
second global transistors electrically connected to the fourth active elements, respectively, and corresponding to the first global transistors,
wherein the peripheral impurity regions comprise the same impurity ions as or different impurity ions from the cell peripheral gate patterns, the cell source and drain regions comprise the same impurity ions as or different impurity ions from the cell gate patterns, the fourth active elements comprise the same structure as the first through third active elements, and the first through fourth active elements, the cell peripheral gate patterns, the common node, the first and second global transistors are 2-dimensionally disposed on the semiconductor substrate in the cell array region and the peripheral circuit region.

12. A unit memory cell array block comprising:
a common node including a plurality of resistive memory elements;
a first active element connected to one of the plurality of resistive memory elements at a lower region of the common node;
a second active element connected to another one of the plurality of resistive memory elements at an upper region of the common node, and stacked on the first active element;
an insulating layer surrounding the common node and interposed between the first and second active elements;
a third active element connected to one of the plurality of resistive memory elements at other lower region, symmetrical to the first active element with respect to the common node; and
a fourth active element connected to other one of the plurality of resistive memory elements at other upper region, symmetrical to the second active element with respect to the common node, wherein the common node includes,
a conductive plug;
a bistable resistance pattern surrounding a sidewall and a bottom surface of the conductive plug; and buffer layers disposed at contacting portion of the bistable resistance pattern and the each of the active elements, wherein the plurality of resistive memory elements are disposed in the bistable resistance pattern between the buffer layer and the conductive plug.

13. A semiconductor memory device comprising:

a substrate having a cell array region and a peripheral circuit region;

a common node on the substrate in the cell array region, and including a plurality of resistive memory elements;

a first body region disposed on the substrate and including first active element connected to one of the plurality of resistive memory elements at a lower region of the common node;

a second body region disposed on the first body region and including a second active element connected to another one of the plurality of resistive memory elements at an upper region of the common node, and stacked on the first active element; and an insulating layer disposed on the substrate, surrounding the common node and interposed between the first and second active elements, wherein the common node includes, a conductive plug;

a bistable resistance pattern surrounding a sidewall and a bottom surface of the conductive plug; and buffer layers disposed on a sidewall of the bistable resistance pattern, wherein the resistive memory elements are disposed in the bistable resistance pattern adjacent to the buffer layer.

14. The semiconductor memory device of claim 13, wherein each of the first and second active elements is one selected from a diode and a transistor.

* * * * *